US012130506B2

(12) United States Patent
Ryu et al.

(10) Patent No.: US 12,130,506 B2
(45) Date of Patent: Oct. 29, 2024

(54) DISPLAY DEVICE USING THERMOCHROMIC PIGMENT AND METHOD FOR MANUFACTURING THE SAME

(71) Applicant: Samsung Display Co., Ltd., Yongin-si (KR)

(72) Inventors: Tae Yong Ryu, Hwaseong-si (KR); Kyoungwoo Park, Hwaseong-si (KR); Hyoungjoo Lee, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 250 days.

(21) Appl. No.: 17/737,489

(22) Filed: May 5, 2022

(65) Prior Publication Data

US 2023/0015124 A1    Jan. 19, 2023

(30) Foreign Application Priority Data

Jul. 16, 2021   (KR) ........................ 10-2021-0093492

(51) Int. Cl.
*G02F 1/01* (2006.01)
*G02F 1/13* (2006.01)

(52) U.S. Cl.
CPC ............ *G02F 1/0147* (2013.01); *G02F 1/132* (2013.01)

(58) Field of Classification Search
None
See application file for complete search history.

(56) References Cited

U.S. PATENT DOCUMENTS

| 5,298,476 | A | * | 3/1994 | Hotta | G02F 1/0147 503/227 |
| 5,558,699 | A | * | 9/1996 | Nakashima | C09D 11/50 503/201 |
| 5,618,581 | A | * | 4/1997 | Sheets | B05D 7/576 427/407.1 |
| 6,664,942 | B1 | * | 12/2003 | Kim | G02F 1/13452 345/55 |
| 9,116,384 | B2 | * | 8/2015 | Park | G02F 1/1336 |
| 9,482,885 | B2 | * | 11/2016 | Joo | G02F 1/1533 |
| 10,180,700 | B2 | * | 1/2019 | Jun | G02B 1/116 |
| 10,483,098 | B2 | | 11/2019 | Um et al. | |
| 10,490,755 | B2 | | 11/2019 | Jang et al. | |

(Continued)

FOREIGN PATENT DOCUMENTS

CN    104838328 A  *  8/2015  ........... G06F 1/1616
CN    206893183 U  *  1/2018

(Continued)

*Primary Examiner* — Timothy J. Dole
*Assistant Examiner* — Muhammed Azam
(74) *Attorney, Agent, or Firm* — KILE PARK REED & HOUTTEMAN PLLC

(57) ABSTRACT

A display device includes a display panel including a first area, a second area, and a bending area disposed between the first area and the second area, the bending area having a curvature radius, a data driver disposed on the display panel and overlapping the second area in a plan view, and a bending protection layer disposed on the display panel and the data driver and overlapping the first area in a plan view, the bending area, and the second area. The bending protection layer includes a thermochromic pigment having a light transmittance that varies according to a temperature.

20 Claims, 11 Drawing Sheets

(56) References Cited

U.S. PATENT DOCUMENTS

| | | | |
|---|---|---|---|
| 10,849,243 B2* | 11/2020 | Sugiyama | G02F 1/0147 |
| 2002/0140654 A1* | 10/2002 | Kim | G02F 1/13452 |
| | | | 345/87 |
| 2008/0008857 A1* | 1/2008 | Kalkanoglu | E04D 5/10 |
| | | | 428/143 |
| 2012/0044278 A1* | 2/2012 | Hwang | G02F 1/0147 |
| | | | 345/204 |
| 2012/0104743 A1* | 5/2012 | Mehta | C09D 11/50 |
| | | | 283/95 |
| 2013/0177703 A1* | 7/2013 | Clayton | B41M 5/287 |
| | | | 427/331 |
| 2014/0177182 A1* | 6/2014 | Cho | H05K 3/30 |
| | | | 361/749 |
| 2015/0028294 A1* | 1/2015 | Kim | H10K 59/38 |
| | | | 257/40 |
| 2015/0091012 A1* | 4/2015 | Namkung | H10K 59/1213 |
| | | | 257/72 |
| 2016/0161770 A1* | 6/2016 | Joo | G02F 1/1533 |
| | | | 359/240 |
| 2017/0117342 A1* | 4/2017 | Kwon | G09G 3/3266 |
| 2018/0122302 A1* | 5/2018 | Koong | G09G 3/035 |
| 2019/0245157 A1* | 8/2019 | Chung | H10K 50/8426 |
| 2020/0041834 A1* | 2/2020 | Teragawa | G02F 1/133512 |
| 2020/0372845 A1* | 11/2020 | Kim | G09G 3/008 |
| 2020/0381638 A1* | 12/2020 | Kim | H10K 71/00 |
| 2021/0000239 A1* | 1/2021 | Silva | C09D 5/26 |
| 2021/0166612 A1* | 6/2021 | Lee | G09G 3/2092 |
| 2021/0396601 A1* | 12/2021 | Abdo | C09D 5/26 |
| 2022/0199951 A1* | 6/2022 | Ryu | H10K 50/844 |
| 2022/0208033 A1* | 6/2022 | Ryu | G09F 9/3026 |
| 2023/0015124 A1* | 1/2023 | Ryu | G02F 1/132 |

FOREIGN PATENT DOCUMENTS

| | | | | | |
|---|---|---|---|---|---|
| CN | 107870472 A | * | 4/2018 | | G02F 1/1309 |
| EP | 3605273 A1 | * | 2/2020 | | G06F 1/1626 |
| JP | H10250229 A | * | 9/1998 | | |
| JP | 2010204648 A | * | 9/2010 | | G02F 1/0147 |
| KR | 20100039776 A | * | 4/2010 | | |
| KR | 20110022482 A | * | 3/2011 | | |
| KR | 101159812 B1 | * | 6/2012 | | |
| KR | 20120065009 A | * | 6/2012 | | |
| KR | 20160092110 A | * | 8/2016 | | |
| KR | 20170042425 A | * | 4/2017 | | |
| KR | 20170051902 A | * | 5/2017 | | |
| KR | 20170052807 A | * | 5/2017 | | |
| KR | 20170073896 A | * | 6/2017 | | |
| KR | 10-2017-0125161 | | 11/2017 | | |
| KR | 10-2018-0033364 | | 4/2018 | | |
| KR | 20180047590 A | * | 5/2018 | | |
| KR | 20180058925 A | * | 6/2018 | | |
| KR | 20180065485 A | * | 6/2018 | | |
| KR | 10-1971049 | | 4/2019 | | |
| KR | 20200084495 A | * | 7/2020 | | |
| KR | 20200101116 A | * | 8/2020 | | |
| KR | 20200120837 A | * | 10/2020 | | |
| KR | 20200127387 A | * | 11/2020 | | |
| KR | 20200143627 A | * | 12/2020 | | |
| KR | 20210072862 A | * | 6/2021 | | |
| KR | 20210077340 A | * | 6/2021 | | |
| KR | 20220148369 A | * | 11/2022 | | |
| TW | 201336980 A | * | 9/2013 | | B43K 1/08 |
| WO | WO-0104694 A1 | * | 1/2001 | | G01K 11/16 |
| WO | WO-2019085016 A1 | * | 5/2019 | | G02F 1/133 |
| WO | WO-2021001287 A1 | * | 1/2021 | | E06B 9/24 |
| WO | WO-2022025346 A1 | * | 2/2022 | | |
| WO | WO-2022207296 A1 | * | 10/2022 | | G02F 1/132 |

* cited by examiner

DISPLAY DEVICE USING THERMOCHROMIC PIGMENT AND METHOD FOR MANUFACTURING THE SAME

CROSS-REFERENCE TO RELATED APPLICATION(S)

This application claims priority to and benefits of Korean Patent Application No. 10-2021-0093492 under 35 U.S.C. § 119, filed on Jul. 16, 2021, in the Korean Intellectual Property Office, the entire contents of which are incorporated herein by reference.

BACKGROUND

The disclosure herein relates to a display device to which a bending protection layer for protecting a bending area and a data driver is applied, and a method for manufacturing the same.

A display device includes an active region that is activated according to an electrical signal. The display device may detect an input applied from the outside through the active region, and simultaneously, may display images to provide information to the user. Recently, as display devices having varied shapes have been developed, active regions having varied shapes are being implemented.

SUMMARY

The disclosure provides a display device having improved durability and reliability and a method for manufacturing the same.

An embodiment provides a display device that may include a display panel including a first area, a second area, and a bending area disposed between the first area and the second area and having a curvature radius, a data driver disposed on the display panel and overlapping the second area in a plan view, and a bending protection layer disposed on the display panel and the data driver, and overlapping the first area, the bending area, and the second area in a plan view. The bending protection layer may include a thermochromic pigment having a light transmittance that varies according to a temperature.

In an embodiment, the light transmittance of the bending protection layer at a temperature lower than a first temperature may be about 1% or less. The light transmittance of the bending protection layer at a temperature equal to or higher than the first temperature may be about 50% or more.

In an embodiment, the bending protection layer may exhibit a first color at a temperature lower than the first temperature and may be transparent at a temperature equal to or higher than the first temperature.

In an embodiment, the first color may be black.

In an embodiment, a light transmittance of the thermochromic pigment may reversibly vary according to a temperature.

In an embodiment, the thermochromic pigment may include an electron acceptor and an electron donor.

In an embodiment, the thermochromic pigment may include liquid crystal molecules.

In an embodiment, the bending protection layer may cover the data driver.

In an embodiment, the display device may further include a printed circuit board bonded to the second area, wherein the bending protection layer may overlap at least a portion of the printed circuit board in a plan view.

In an embodiment, the display device may further include an anti-reflection layer disposed on the display panel, and overlapping the first area in a plan view. A portion of the bending protection layer, which overlaps the first area of the display panel, may not overlap the anti-reflection layer on a in a plan view.

In an embodiment, the display panel may include a first non-folding area, a folding area, and a second non-folding area which are sequentially disposed in a direction. The folding area may be folded with respect to a folding axis.

In an embodiment, a display device includes a display panel including a first area, a second area, and a bending area disposed between the first area and the second area, the bending area having a curvature radius, a data driver disposed on the display panel, and overlapping the second area in a plan view; and a bending protection layer disposed on the display panel and overlapping the first area, the bending area, and the second area in a plan view and that covers the data driver. The bending protection layer may include a reversible thermochromic pigment.

In an embodiment, the reversible thermochromic pigment may exhibit a black color at a temperature lower than a first temperature and may be transparent at a temperature equal to or higher than the first temperature or more.

In an embodiment, the bending protection layer may further include a base resin, and the base resin may include at least one of an acrylic-based polymer, a urethane-based polymer, a silicon-based polymer, and an imide-based polymer.

In an embodiment, a method for manufacturing a display device may include providing a resin including a base resin, a thermochromic pigment, and a photoinitiator on a first area, a bending area, and a second area, applying heat to the resin to generate a temperature condition equal to or higher than a first temperature to form a preliminary bending protection layer, and providing light having a first wavelength region to the preliminary bending protection layer to form a bending protection layer. The display device may include a display panel including the first area, the bending area, the second area which are sequentially disposed in a direction, and a data driver disposed on the display panel, the data driver overlapping the second area.

In an embodiment, the thermochromic pigment may exhibit a first color at a temperature lower than the first temperature and may be transparent at a temperature equal to or higher than the first temperature.

In an embodiment, the first temperature may be in a range of about 30° C. to about 80° C.

In an embodiment, the forming of the preliminary bending protection layer may include providing light having a second wavelength region to apply heat to the resin, the second wavelength region and the first wavelength region being different.

In an embodiment, the photoinitiator may be activated by the light having the first wavelength region.

In an embodiment, the providing of the resin may include applying the resin to cover the data driver.

BRIEF DESCRIPTION OF THE DRAWINGS

The accompanying drawings are included to provide a further understanding of the embodiments, and are incorporated in and constitute a part of this specification. The drawings illustrate embodiments and, together with the description, serve to explain principles of the embodiments. In the drawings.

DETAILED DESCRIPTION OF THE EMBODIMENTS

Figure 1A:
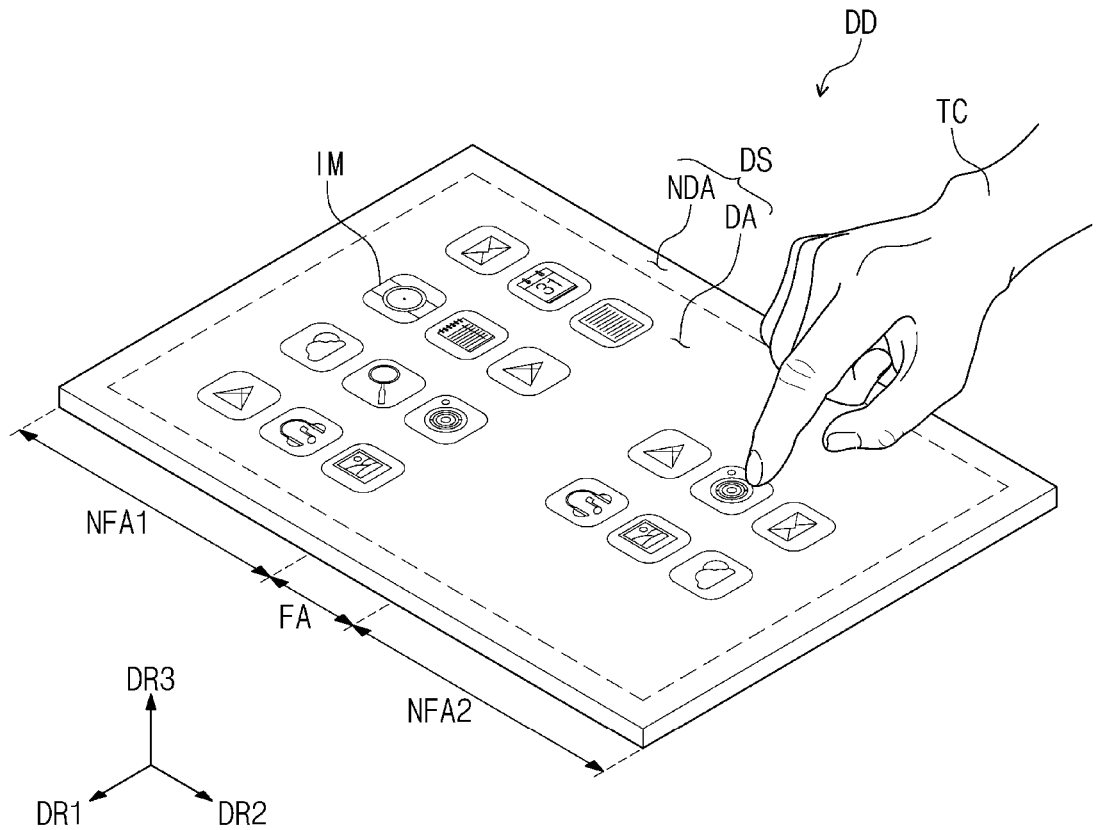
FIG. 1A is a schematic perspective view of a display device according to an embodiment.

Hereinafter, embodiments will be described with reference to the accompanying drawings.

In this specification, it will also be understood that when one component (or region, layer, portion) is referred to as being 'on,' 'connected to,' or 'coupled to' another component, it can be directly connected/coupled on/to the one component, or an intervening third component may also be present.

Like reference numerals refer to like elements throughout. Also, in the figures, the thickness, ratio, and dimensions of components are exaggerated for clarity of illustration.

It will be understood that although the terms such as 'first' and 'second' are used herein to describe various elements, these elements should not be limited by these terms. The terms are only used to distinguish one component from other components. For example, a first element referred to as a second element, and similarly, a second element may be referred to as a first element without departing from the scope of the disclosure.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

Also, ""under," "below," "above," "upper," and the like are used for explaining relation association of components illustrated in the drawings. The terms may be a relative concept and described based on directions expressed in the drawings.

The meaning of "include" or "comprise" specifies a property, a fixed number, a step, an operation, an element, a component or a combination thereof, but does not exclude other properties, fixed numbers, steps, operations, elements, components or combinations thereof.

In this specification, "being directly disposed" may mean that there is no layer, film, area, plate, or the like between a portion of the layer, the film, the area, the plate, or the like and the other portion. For example, "being directly disposed" may mean being disposed without using an additional member such and an adhesion member between two layers or two members.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

"About," "substantially," or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by a person of ordinary skill in the art to which the disclosure belongs. It will be further understood that terms, such as those defined in commonly used dictionaries, should be interpreted as having a meaning consistent with the meaning in the context of the related technology, and unless explicitly defined here, they will not be interpreted in an idealized or overly formal sense.

Hereinafter, embodiments will be described with reference to the accompanying drawings.

Figure 1B:
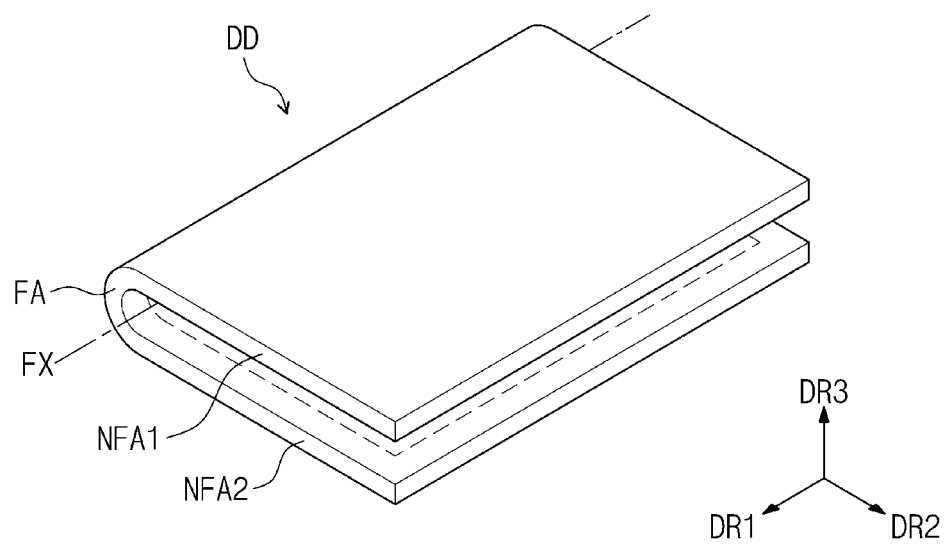
FIG. 1B is a schematic perspective view of a display device according to an embodiment.

FIG. 1A is a schematic perspective view of a display device according to an embodiment. FIG. 1B is a schematic perspective view of a display device according to an embodiment. FIG. 1A illustrates an unfolded state of a display device DD, and FIG. 1B illustrates a folded state of the display device DD illustrated in FIG. 1A.

Referring to FIGS. 1A and 1B, the display device DD may be a foldable display device. The display device DD according to an embodiment may be used for large-sized electronic devices such as televisions and monitors and small and middle-sized electronic devices such as mobile phones, tablet PC, navigation units for vehicles, game consoles, and smart watches.

A top surface of the display device DD may be defined as a display surface DS. In a state in which the display device DD is unfolded, i.e., in a flat state of the display device DD, the display surface DS may have a plane defined by a first direction DR1 and a second direction DR2. A thickness direction of the display device DD may be parallel to a third direction DR3 crossing the first direction DR1 and the second direction DR2. Thus, a front surface (or top surface) and a rear surface (or bottom surface) of each of members constituting the display device DD may be defined based on the third direction DR3.

The display surface DS may include a display area DA and a non-display area NDA around the display area DA. The display area DA is an area on which an image IM is displayed, and a non-display area NDA is an area on which the image IM is not displayed. Application icons are illustrated as an example of the image IM in FIG. 1A.

The display area DA may have a rectangular shape. The non-display area NDA may surround the display area DA. However, the embodiments are not limited thereto. For example, the shape of the display area DA and the non-display area NDA may be designed in relation to each other.

The display device DD according to an embodiment may sense a user's input TC applied from the outside. The user's input TC includes various types of external inputs such as a portion of user's body, light, heat, a pressure, or the like. In this embodiment, the user's input TC is illustrated as a user's hand applied to the front surface. However, this is merely an example. As described above, the user's input TC may be provided in various forms (for example, input using a user's hand, input using a mechanism such as a touch pen or a stylus pen, and the like). Also, the display device DD may sense the user's input TC applied to a side surface or a rear surface of the display device DD according to the structure of the display device DD, but the embodiments are not limited thereto.

The display device DD may activate the display surface DS to display the image IM and also sense an external input TC. In an embodiment, an area on which the external input TC is sensed may be provided on the display area DA on which the image IM is displayed. However, this is merely an example. For example, the area on which the external input TC is sensed may be provided on the non-display area NDA or provided on the entire area of the display surface DS.

A first non-folding area NFA1, a folding area FA, and a second non-folding area NFA2 may be sequentially defined (for example, disposed in a sequence) along the first direction DR1 in the display device DD. For example, the folding area FA may be defined between the first non-folding area NFA1 and the second non-folding area NFA2. In FIGS. 1A and 1B, although one folding area FA and two first and second non-folding areas NFA1 and NFA2 are provided, the embodiments are not limited thereto. For example, the number of folding areas FA and the number of non-folding areas NFA1 and NFA2 are not limited thereto. The display device DD may include more than two non-folding areas and folding areas between the non-folding areas.

The display device DD may be folded with respect to a folding axis FX. For example, the folding area FA may be bent with respect to the folding axis FX. The folding axis FX may extend in the first direction DR1. The folding axis may be defined as a short axis parallel to the short side of the display device DD.

When the display device DD is folded, a display surface of the first non-folding area NFA1 and a display surface of the second non-folding area NFA2 may face each other. Thus, in the folded state, the display surface DS may not be exposed to the outside. However, this is mere an example, and the embodiments are not limited thereto. In an embodiment, when the display device DD is folded, the display surface of the first non-folding area NFA1 and the display surface of the second non-folding area NFA2 may face each other. Thus, in the folded state, the display surface DS may be exposed to the outside.

Figure 2A:
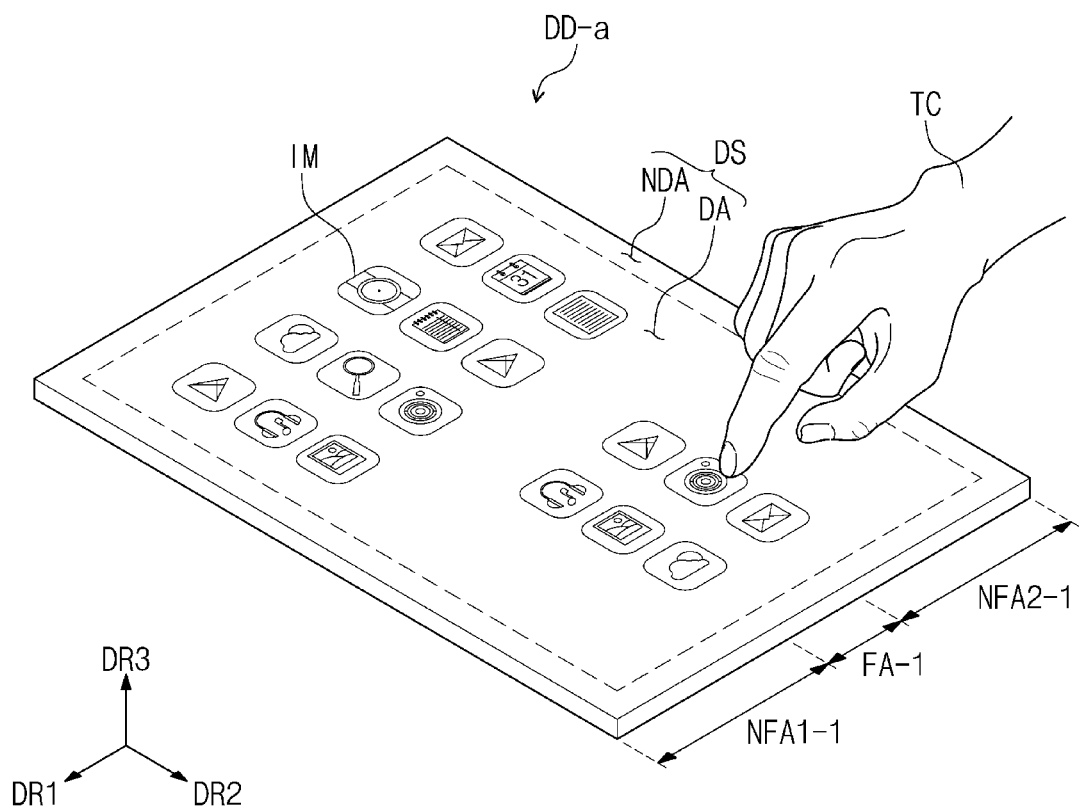
FIG. 2A is a schematic perspective view of a display device according to an embodiment.
Figure 2B:
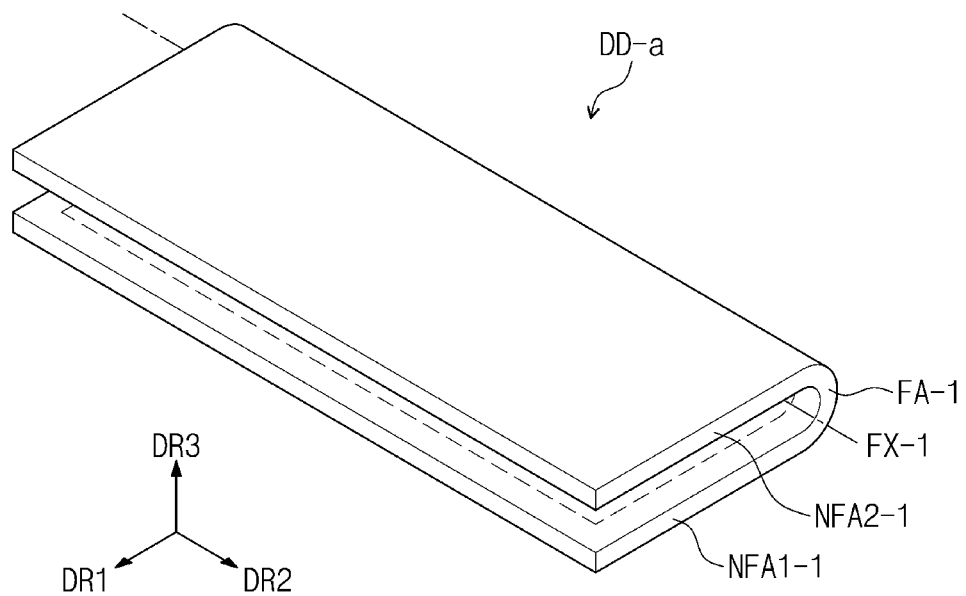
FIG. 2B is a schematic perspective view of a display device according to an embodiment.

FIG. 2A is a schematic perspective view of a display device according to an embodiment. FIG. 2B is a schematic perspective view of a display device according to an embodiment. FIG. 2A illustrates an unfolded state of a display device DD-a, and FIG. 2B illustrates a folded state of the display device DD-a illustrated in FIG. 2A.

Referring to FIGS. 2A and 2B, a first non-folding area NFA1-1, a folding area FA-1, and a second non-folding area NFA2-1 may be sequentially defined (for example, disposed in a sequence) along the first direction DR1 in the display device DD-a. The folding area FA-1 may be defined between the first non-folding area NFA1-1 and the second non-folding area NFA2-1.

The display device DD-a may be folded with respect to a folding axis FX-1. For example, the folding area FA-1 may be bent based on the folding axis FX-1. The folding axis FX-1 may extend in the second direction DR2. The folding axis FX-1 may be defined as a long axis that is parallel to a long side of the display device DD-a.

Hereinafter, a structure of the display device DD that is folded with respect to a short axis will be described, but is not limited thereto, and structures described later may be applied to the display device DD-a that is folded with respect to the short axis.

Figure 3:
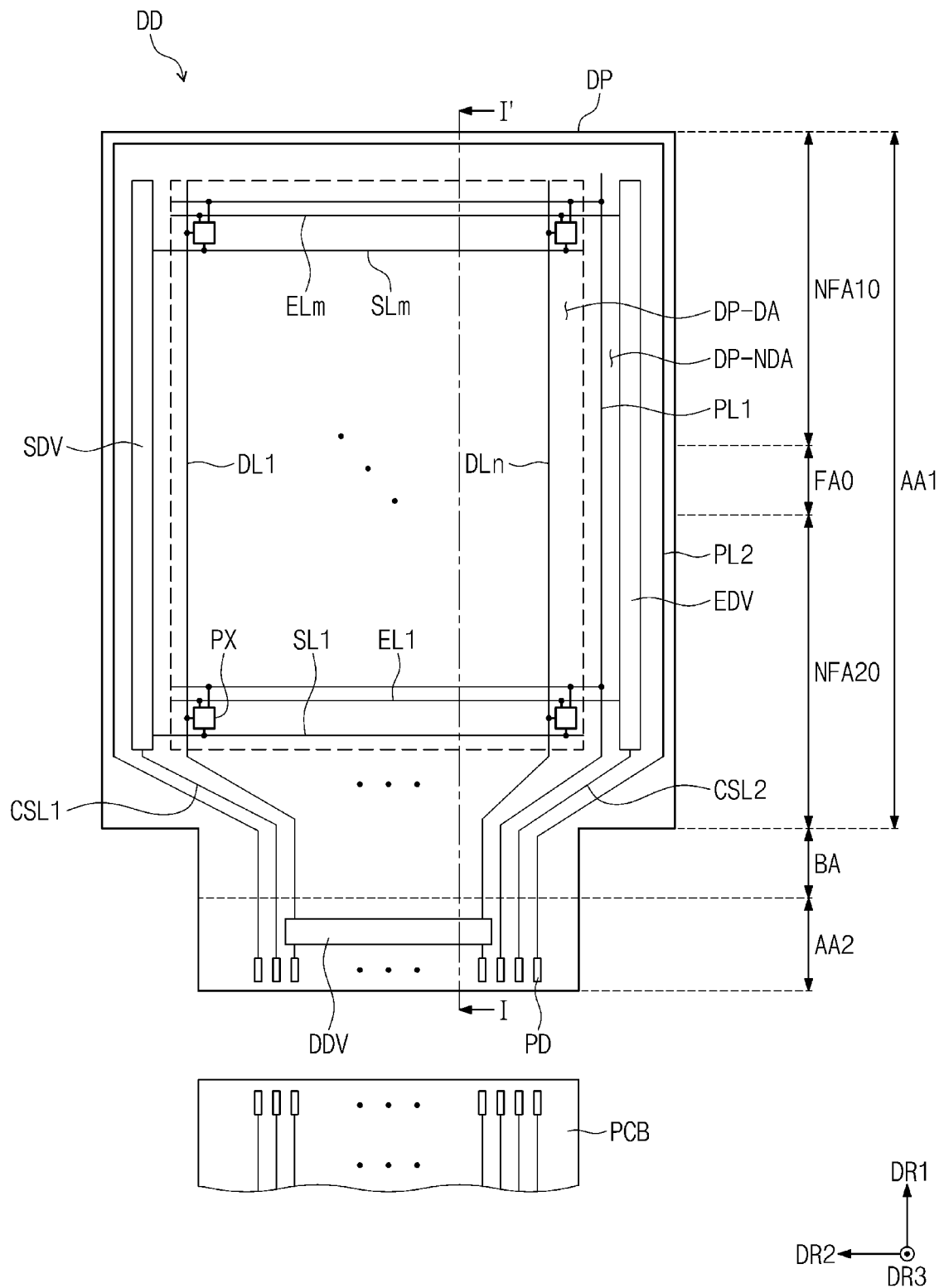
FIG. 3 is a schematic plan view of a display panel according to an embodiment.
Figure 4:
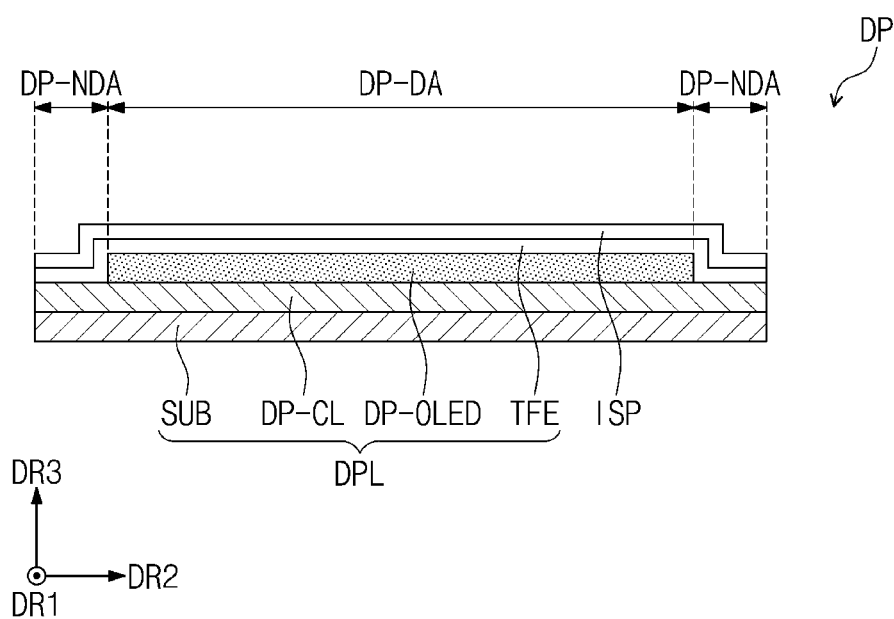
FIG. 4 is a schematic cross-sectional view of the display module DM according to an embodiment.

FIG. 3 is a schematic plan view of a display panel DP according to an embodiment. FIG. 4 is a schematic cross-sectional view of the display module DM according to an embodiment.

The display panel DP according to an embodiment may be an emission-type display panel, but is not particularly limited thereto. For example, the display panel DP may be an organic light emitting display panel or a quantum dot light emitting display panel. An emission layer of the organic light emitting display panel may include an organic light emitting material. An emission layer of the quantum dot light emitting display panel may include a quantum dot, a quantum rod, and the like. Hereinafter, the display panel DP will be described as an organic light emitting display panel.

Referring to FIG. 3, the display panel DP may include a display area DP-DA and a non-display area DP-NDA around the display area DP-DA. The display area DP-DA and the non-display area DP-NDA are divided according to whether a pixel PX is disposed. The display area DP-DA and the non-display area DP-NDA correspond to the display area DA and the non-display area NDA of FIG. 1A, respectively. In this specification, when an area/portion and another area/portion are referred to as corresponding, that the areas/portions may overlap each other, and the areas/portions and are not limited to a same size area. A scan driver SDV, a data driver DDV, and an emission driver EDV may be disposed on the non-display area DP-NDA.

Figure 5:
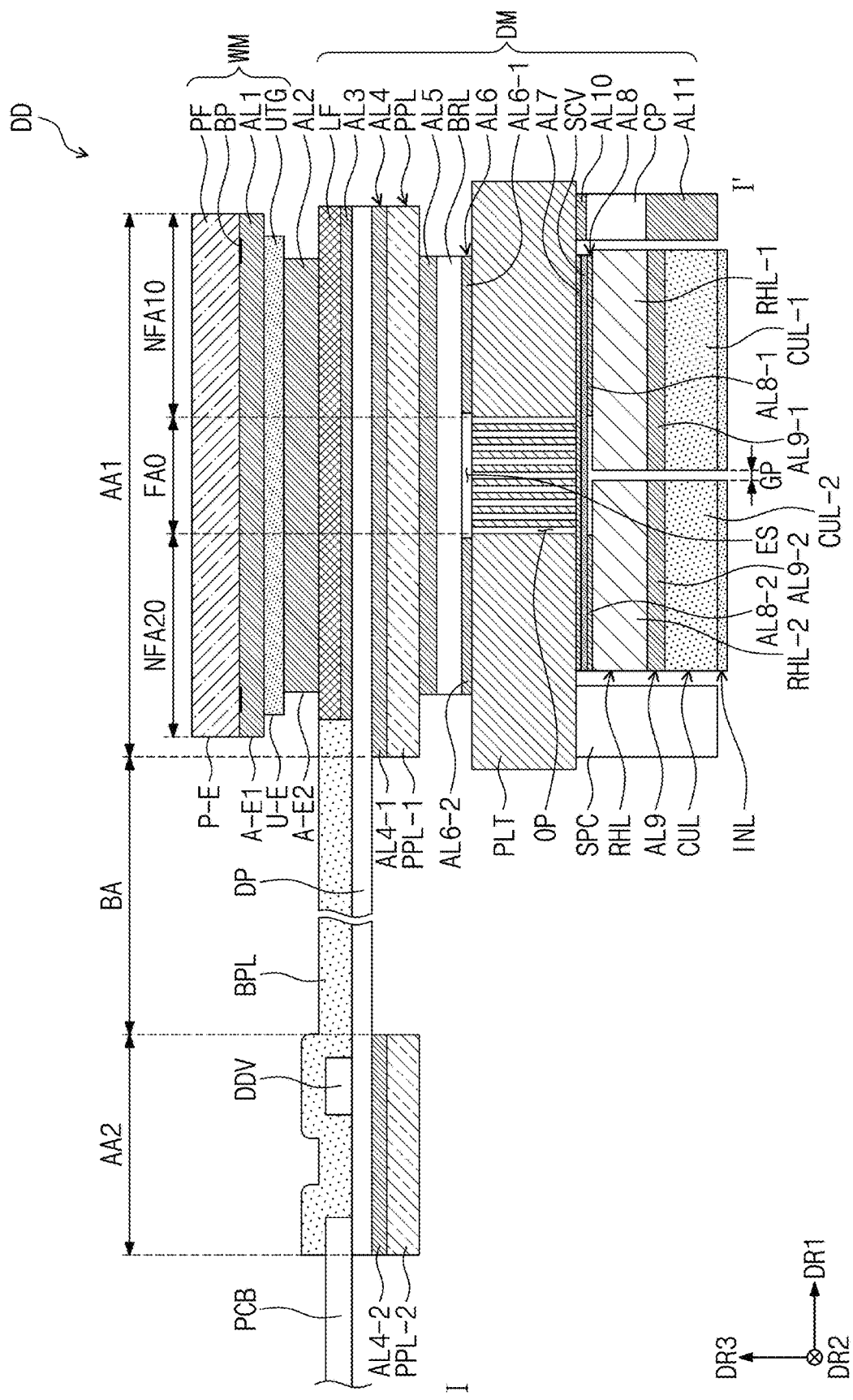
FIGS. 5 and 6 are schematic cross-sectional views of a display panel according to an embodiment.

The display panel DP includes a first area AA1, a second area AA2, and a bending area BA, which are divided in the first direction DR1. In case that the display device DD is unfolded as illustrated in FIG. 1A, the first area AA1 and the second area AA2 of the display panel DP mounted on the display device DD are disposed on different planes. This structure is illustrated in FIG. 5. The bending area BA is disposed between the first area AA1 and the second area AA2. The bent shape of the bending area BA will be described below with reference to FIG. 6. FIG. 3 illustrates a state in which the display panel DP is unfolded before being mounted on the display device DD.

The first area AA1 corresponds to the display surface DS of FIG. 1A. The first area AA1 may include a first non-folding area NFA10, a second non-folding area NFA20, and a folding area FA0. The first non-folding area NFA10, the second non-folding area NFA20, and the folding area FA0 correspond to the first non-folding area NFA1, the second non-folding area NFA2, and the folding area FA of FIG. 1A, respectively.

A length of each of the bending area BA and the second area AA2 in the second direction DR2 may be less than that of the first area AA1. Each of the second area AA2 and the bending area BA may be a part of the non-display area DP-NDA.

The display panel DP includes pixels PX, scan lines SL1 to SLm, data lines DL1 to DLn, emission lines EL1 to ELm, first and second control lines CSL1 and CSL2, a first power line PL1, a second power line PL2, and pads PD. Here, m and n are natural numbers. The pixels PX may be electrically connected to the scan lines SL1 to SLm, the data lines DL1 to DLn, and the emission lines EL1 to ELm.

The data driver DDV may be disposed on the second area AA2. The data driver DDV may be an integrated circuit chip. The scan lines SL1 to SLm may extend in the second direction DR2 and be electrically connected to the scan driver SDV. The data lines DL1 to DLn may extend in the first direction DR1 and be electrically connected to the data driver DDV via the bending area BA. The emission lines EL1 to ELm may extend in the second direction DR2 and be electrically connected to a gate driver EDV.

The first power line PL1 may include a portion extending in the first direction DR1 and a portion extending in the second direction DR2. The portion extending in the first direction DR1 and the portion extending in the second direction DR2 may be disposed on different layers. The portion of the first power line PL1, which extends in the first direction DR1, may extend to the second area AA2 via the bending area BA. The first power line PL1 may provide pixels PX having a first voltage.

The second power line PL2 may be disposed on the non-display area DP-NDA along an edge of the first area AA1. The second power line PL2 may be disposed outside the scan driver SDV and the emission driver EDV.

The first control line CSL1 may be electrically connected to the scan driver SDV to extend toward a lower end of the second area AA2 via the bending area BA. The second control line CSL2 may be electrically connected to the emission driver EDV to extend toward the lower end of the second area AA2 via the bending area BA.

In a plan view, the pads PD may be disposed adjacent to the lower end of the second area AA2. The data driver DDV, the first power line PL1, the second power line PL2, the first control line CSL1, and the second control line CSL2 may be electrically connected to the pads PD. A printed circuit board PCB may be electrically connected to the pads PD through an anisotropic conductive adhesive layer.

Each of the pixels PX may include a light emitting element and a pixel data driver that controls light emission of the light emitting element. The pixel data driver includes transistors and at least one capacitor.

Referring to FIG. 4, the display panel DP may include a display layer DPL and an input sensor ISP disposed on the display layer DPL. The display panel DPL may include a base layer SUB, a circuit element layer DP-CL disposed on the base layer SUB, and a display element layer DP-OLED disposed on the circuit element layer DP-CL, and a thin film encapsulation layer TFE disposed on the display element layer DP-OLED.

The base layer SUB may include a synthetic resin film. For example, the base layer SUB may include polyimide (PI). The base layer SUB may have a multi-layered structure. The base layer SUB may include a first synthetic resin film, at least one inorganic layer disposed on the first synthetic resin film, and a second synthetic resin film disposed on the inorganic layer. Each of the first synthetic resin film and the second synthetic resin film may be a polyimide film.

The circuit element layer DP-CL may include an organic layer, an inorganic layer, a semiconductor pattern, a conductive pattern, and a signal line. The organic layer, the inorganic layer, the semiconductor layer, and the conductive layer may be formed on the base layer SUB in a manner such as coating, deposition, and the like. Thereafter, the organic layer, the inorganic layer, the semiconductor layer, and the conductive layer may be selectively patterned through photolithography processes to form the semiconductor pattern, the conductive pattern, and the signal line.

The semiconductor pattern, the conductive pattern, and the signal line may form the pixel data driver and the signal lines SL1 to SLm, DL1 to DLn, EL1 to ELm, CSL1, CSL2, PL1, and PL2 of the pixels PX described with reference to FIG. 2A The pixel data driver may include at least one transistor.

The display element layer DP-OLED includes the light emitting element of each of the pixels PX described with reference to FIG. 3. The light emitting element is electrically connected to the at least one transistor. The display device layer DP-OLED may further include at least one of an organic layer and an inorganic layer.

The thin film encapsulation layer TFE may be disposed on the circuit element layer DP-CL to cover the display element layer DP-OLED. The thin film encapsulation layer TFE may include an inorganic layer, an organic layer, and an inorganic layer, which are sequentially laminated. The lamination structure of the thin film encapsulation layer is not particularly limited thereto.

In a plan view, the shape of the base layer SUB is substantially the same as the planar shape of the display panel DP illustrated in FIG. 3. The base layer SUB is disposed on the display area DP-DA and the non-display area DP-NDA.

The pixel data driver of the circuit element layer DP-CL is disposed in the display area DP-DA. Some of the signal lines SL1 to SLm, DL1 to DLn, EL1 to ELm, CSL1, CSL2, PL1, and PL2 of the circuit element layer DP-CL are the display area DP-DA and the non-display area DP-NDA.

The light emitting element of the display element layer DP-OLED is disposed on the display area DP-DA. The thin film encapsulation layer TFE is disposed on the display area DP-DA and the non-display area DP-NDA. However, the thin film encapsulation layer TFE may sufficiently cover the display area DP-DA and may not completely cover the non-display area DP-NDA.

The input sensor ISP may include electrodes (not shown) that senses an external input TC (refer to FIG. 1A), trace lines (not shown) connected to the electrodes, and an organic layer and/or inorganic layer that insulates/protects the electrodes or the trace lines. The input sensor ISP may be a capacitive sensor, but is not particularly limited thereto.

The input sensor ISP may be directly disposed on the thin film encapsulation layer TFE through a continuous process when the display module DM is manufactured. However, the embodiments are not limited thereto, and the input sensor ISP may be provided as a panel that is separated from the display panel DP and may be attached to the display module DM by an adhesive layer.

The electrodes of the input sensor ISP are disposed on the display area DP-DA. The trace lines of the input sensor ISP are disposed on the non-display area DP-NDA.

The trace lines may extend toward the lower end of the second area AA2 via the bending area BA so as to be adjacent to the pad PD illustrated in FIG. 3. Here, the trace lines are disposed on a layer that is different from that on which the signal lines SL1 to SLm, DL1 to DLn, EL1 to ELm, CSL1, CSL2, PL1, and PL2 of the circuit element layer DP-CL are disposed.

The trace lines may be electrically connected to signal lines (input signal lines) provided for the input sensor ISP of the display panel DP on the first area AA1 illustrated in FIG. 3. The input signal lines may be signal lines different from the signal lines SL1 to SLm, DL1 to DLn, EL1 to ELm, CSL1, CSL2, PL1, and PL2 illustrated in FIG. 3, but may be disposed on the same layer as any one of the signal lines. Each of the input signal lines may be electrically connected to the corresponding pad PD.

At least one of the organic layer and the inorganic layer of the input sensor ISP may be disposed on the first area AA1 illustrated in FIG. 3. At least one of the organic layer and the inorganic layer may extend to the bending area BA.

Figure 6:
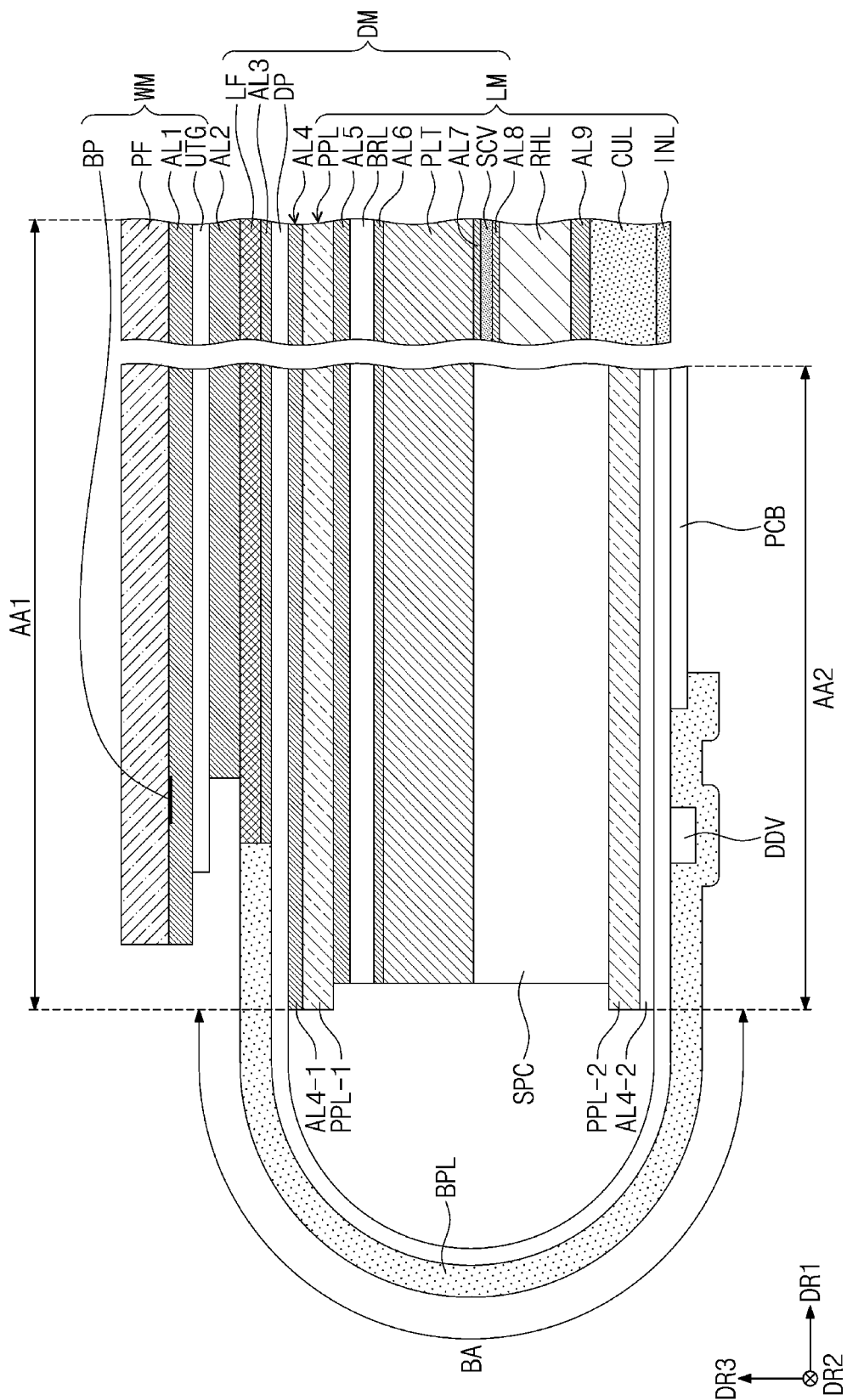

FIGS. 5 and 6 are schematic cross-sectional views of the display panel according to an embodiment. FIG. 5 is a schematic cross-sectional view of the display device DD, taken along line I-I' of FIG. 3. FIG. 5 illustrates the bending area unfolded in a cross section corresponding to the line I-I' illustrated in FIG. 3. FIG. 6 is a schematic partial view illustrating a state in which the bending area is bent in the display device of FIG. 5.

Referring to FIG. 6, when the bending area BA of the display panel DP is bent, the first area AA1 and the second area AA2 of the display panel DP may be disposed on different planes. The second area AA2 may be disposed under the first area AA1.

Referring to FIGS. 5 and 6, a window module WM may include a thin glass substrate UTG, a plastic film PF disposed on the thin glass substrate UTG, a first adhesive layer AL1 through which the thin glass substrate UTG and the plastic film PF are bonded to each other, and a bezel pattern BP.

The bezel pattern BP may overlap the non-display area NDA illustrated in FIG. 1A. The bezel pattern BP may be disposed on a surface of the thin glass substrate UTG or a surface of the plastic film PF. FIGS. 5 and 6 illustrates an example of the bezel pattern BP disposed on a bottom surface of the plastic film PF. However, the embodiments are not limited thereto, and the bezel pattern BP may be disposed on a top surface of the plastic film PF. The bezel pattern BP may be formed as a colored light blocking layer, for example, in a coating manner. The bezel pattern BP may include a base material and a dye or pigment mixed with the base material. The bezel pattern BP may have a closed line shape in a plan view.

The thin glass substrate UTG may have a thickness in a range of about 15 µm (micrometers) to about 45 µm, for example, about 30 µm. The thin glass substrate UTG may be chemically strengthened glass. As the thin glass substrate UTG is applied, occurrences of wrinkles may be minimized even if the folding and unfolding are repeated. In an embodiment, a synthetic resin film may be applied instead of the thin glass substrate UTG.

The plastic film PF may have a thickness in a range of about 50 µm to about 80 µm, for example, about 65 µm. The plastic film PF may include polyimide, polycarbonate, polyamide, triacetylcellulose, polymethylmethacrylate, or polyethylene terephthalate. Although not shown separately, at least one of a hard coating layer, an anti-fingerprint layer, and an anti-reflection layer may be disposed on a top surface of the plastic film PF.

The first adhesive layer AL1 may be a layer including a transparent adhesive material such as a pressure sensitive adhesive (PSA), an optically clear adhesive (OCA), or an optically clear resin (OCR). Hereinafter, the adhesive member may include a general adhesive or adhesive agent.

The first adhesive layer AL1 may have a thickness in a range of about 20 µm to about 50 µm, for example, about 35 µm. The first adhesive layer AL1 may have a thickness that is sufficient to cover the bezel pattern BP. For example, the bezel pattern BP may have a thickness in a range of about 3 µm to about 8 µm, and the first adhesive layer AL1 may have a thickness at which bubbles are not generated in the periphery of the bezel pattern BP.

The first adhesive layer AL1 may be separated from the thin glass substrate UTG. Since strength of the plastic film PF is lower than that of the thin glass substrate UTG, scratches may occur relatively easily. After the first adhesive layer AL1 and the plastic film PF are separated from each other, a new plastic film PF may be attached to the thin glass substrate UTG.

In a plan view, an edge U-E of the thin glass substrate UTG may not overlap the bezel pattern BP. As the above conditions are satisfied, the edge U-E of the thin glass substrate UTG may be exposed from the bezel pattern BP, and fine cracks generated in the edge U-E of the thin glass substrate UTG are inspected through an inspection device. The inspection device may include a microscope. The edge U-E of the thin glass substrate UTG on the top surface of the plastic film PF may be photographed using the inspection device to check the cracks originating from the edge U-E of the thin glass substrate UTG. However, the embodiments are not limited thereto, and the bezel pattern BP may overlap the edge U-E of the thin glass substrate UTG.

In a plan view, the edge P-E of the plastic film PF and an edge A-E1 of the first adhesive layer AL1 may be aligned with each other. The plastic film PF and the first adhesive layer AL1 may have the same area and the same shape.

The window module WM and the display module DM may be bonded to each other by the second adhesive layer AL2. The second adhesive layer AL2 may include a transparent adhesive such as a pressure sensitive adhesive or an optically transparent adhesive. The second adhesive layer AL2 may have a thickness in a range of about 35 µm to about 65 µm, for example, about 50 µm.

In a plan view, an edge A-E2 of the second adhesive layer AL2 may overlap the window module WM. For example, the edge A-E2 of the second adhesive layer AL2 may overlap the thin glass substrate UTG. In the process of attaching the window module WM to the display module DM, a pressure may be applied to the second adhesive layer AL2. The second adhesive layer AL2 may receive pressure and then be stretched in a direction parallel to the first direction DR1 and the second direction DR2. Here, a surface area of the second adhesive layer AL2 may be less than that of the thin glass substrate UTG so that the second adhesive layer AL2 does not protrude from the thin glass substrate UTG.

In case that the first adhesive layer AL1 and the second adhesive layer AL2 are attached to each other, during the folding operation of the display device DD, the thin glass substrate UTG may not slip. This and may cause buckling or may generate cracks in the thin glass substrate UTG. However, according to the embodiment, since the area of the second adhesive layer AL2 is less than that of the thin glass substrate UTG, the first adhesive layer AL1 and the second adhesive layer AL2 may be prevented from being attached to each other. Thus, the possibility that that foreign substances adhere to the second adhesive layer AL2 may be reduced.

The display module DM may include an anti-reflection layer LF, a display panel DP, a panel protection layer PPL, a barrier layer BRL, a support layer PLT, a cover layer SCV, a heat dissipation layer RHL, a cushion layer CUL, an insulating layer INL, a spacer SPC, a step compensation pattern CP, and third to eleventh adhesive layers AL3 to AL11. Each of the third to eleventh adhesive layers AL3 to AL11 may include a transparent adhesive such as a pressure-sensitive adhesive or an optically transparent adhesive. Some of the above-described constituents according to an embodiment may be omitted. For example, the step compensation pattern CP and the tenth and eleventh adhesive layers AL10 and AL11 associated therewith may be omitted.

The anti-reflection layer LF is disposed on the first area AA1 of the display panel DP. The anti-reflection layer LF covers at least the display area DP-DA (refer to FIG. 4). The second adhesive layer AL2 is bonded to the anti-reflection layer LF and the window module WM, and the third adhesive layer AL3 is bonded to the anti-reflection layer LF and the display panel DP.

The anti-reflection layer LF may reduce reflectance of external light incident from the outside. The anti-reflection layer LF may include a stretchable synthetic resin film. For example, the anti-reflection layer LF may be provided by dyeing an iodine compound to a polyvinyl alcohol film (PVA film). However, this is merely an example, and the material forming the anti-reflection layer LF is not limited thereto. The anti-reflection layer LF may have a thickness in a range of about 25 μm to about 35 μm, for example, about 31 μm, but the thickness of the anti-reflection layer LF is not limited thereto.

The anti-reflection layer LF according to an embodiment may include color filters. The color filters may have a selected arrangement. The arrangement of the color filters may be selected in consideration of emission colors of the pixels provided in the display layer DPL (refer to FIG. 4). The anti-reflection layer LF may include a black matrix adjacent to the color filters.

The anti-reflection layer LF according to an embodiment may include a destructive interference structure. For example, the destructive interference structure may include first reflection layer and a second reflection layer, which are disposed on layers different from each other. First reflected light and second reflected light, which are respectively reflected from the first reflection layer and the second reflection layer, may destructively interfere with each other, and thus, the reflectance of external light may be reduced.

The anti-reflection layer LF may be bonded to the display panel DP through the third adhesive layer AL3. The third adhesive layer AL3 may have a thickness in a range of about 20 μm to about 70 μm, for example, about 50 μm, and the thickness of the third adhesive layer AL3 is not limited thereto.

In an embodiment, the third adhesive layer AL3 may be omitted. The anti-reflection layer LF may be directly disposed on the display panel DP. A separate adhesive layer may not be disposed between the anti-reflection layer LF and the display panel DP.

As illustrated in FIG. 5, in the state in which the bending area BA of the display device DD is unfolded, the anti-reflection layer LF may not overlap the bending protection layer BPL. For example, the bending protection layer BPL may not overlap the anti-reflection layer LF in a plan view, thereby minimizing an increase in thickness of the bending protection layer BPL. Thus, an overall thickness of the display device DD may be prevented from increasing, the bending of the bending area BA and the bending protection layer BPL of the panel DP may be facilitated.

The data driver DDV may be disposed on the second area AA2 of the display panel DP. The data driver DDV may be mounted on the second area AA2 of the display panel DP. Although not shown, the display device DD may include connection lines electrically connecting the display panel DP to the data driver DDV.

The printed circuit board PCB may be electrically connected to the display panel DP. For example, the printed circuit board PCB may be electrically connected to a side of the second area AA2 of the display panel DP. Although not shown, the printed circuit board PCB may include a base layer and a timing controller disposed on the base layer. The timing controller may be provided as an integrated circuit chip and mounted on a top surface of the base layer. A portion of the printed circuit board PCB may be spaced apart from the data driver DDV in a plan view and disposed on the second area AA2. The data driver DDV may be disposed between the printed circuit board PCB and the anti-reflection layer LF in a plan view.

The display device DD may include the bending protection layer BPL disposed on the display panel DP. The bending protection layer BPL may be disposed between the display panel DP and the printed circuit board PCB. The bending protection layer BPL may relieve stress generated as the display panel DP is bent.

The bending protection layer BPL may overlap the first area AA1, the bending area BA, and the second area AA2 of the display panel DP. In an embodiment, a portion of the bending protection layer BPL overlapping the first area AA1 of the display panel DP may not overlap the anti-reflection layer LF in a plan view. The bending protection layer BPL may include a first protection portion overlapping the first area AA1, a second protection portion overlapping the bending area BA, and a third protection portion overlapping the second area AA2. The first protection portion of the bending protection layer BPL may not overlap the anti-reflection layer LF in a plan view. For example, the first protection portion of the bending protection layer BPL may be disposed adjacent to the anti-reflection layer LF and may not overlap the anti-reflection layer LF in a plan view. However, the embodiments are not limited thereto, and the first protection portion of the bending protection layer BPL may overlap the anti-reflection layer LF in a plan view. Although a side surface of the first protection portion of the bending protection layer BPL is illustrated as contacting the side surface of the anti-reflection layer LF in FIGS. 5 and 6, the embodiments are not limited thereto. For example, the side surface of the first protection portion of the bending protection layer BPL may be disposed to be spaced apart from an edge of the anti-reflection layer LF in a plan view.

The bending protection layer BPL may be disposed on the data driver DDV. The bending protection layer BPL may be disposed on the data driver DDV to protect the data driver DDV disposed on the second area AA2 of the display panel DP. The bending protection layer BPL may cover the data driver DDV. The bending protection layer BPL may be disposed on the display panel DP to completely cover the data driver DDV, thereby protecting the data driver DDV disposed on the display panel DP.

The bending protection layer BPL may overlap at least a portion of the printed circuit board PCB in a plan view. The bending protection layer BPL may be disposed on a portion of the first area AA1, which is adjacent to the bending area BA, and extends to the bending area BA and the second area AA2 to cover the edge of the printed circuit board PCB bonded to the second area AA2 of the display panel DP. However, the embodiments are not limited thereto, and the bending protection layer BPL may not overlap the printed circuit board PCB in a plan view.

The bending protection layer BPL may have a thickness of about 500 µm or less. For example, the bending protection layer BPL may have a thickness of about 10 µm or more and about 200 µm or less. In case that the thickness of the bending protection layer BPL is within such a range, durability and flexibility may be secured without excessively increasing total thickness of the bending protection layer BPL, and thus, the display device DD having improved mechanical reliability may be implemented. In this specification, the thickness of the bending protection layer BPL may represent a mean value of the thickness of the bending protection layer BPL provided on one surface of the display panel DP. The thickness of the bending protection layer BPL may be an arithmetic mean value of the bending protection layer BPL measured at the shortest distance from the bottom surface of the bending protection layer BPL to the top surface of the bending protection layer BPL.

The bending protection layer BPL according to an embodiment may be disposed on the data driver DDV on the second area AA2 to protect the data driver DDV. The bending protection layer BPL may protect the data driver DDV from an external impact and light incident from the outside. In an embodiment, a separate cover tape may not be disposed on the data driver DDV, and the bending protection layer BPL may extend onto the second area AA2 to cover the data driver DDV. Thus, the separate cover tape that covers the data driver DDV may not be used.

The bending protection layer BPL protecting the bending area BA of the display device DD and the cover tape protecting the data driver DDV may be provided as separate components. For example, a process of forming the bending protection layer BPL on the display panel DP and a process of attaching the cover tape covering the data driver DDV may be performed separately.

According to an embodiment, as the bending protection layer BPL extends from the first area AA1 to cover the data driver DDV, a process time may be reduced. For example, the overall manufacturing process of the display device DD may be more facilitated.

In an embodiment, the bending protection layer BPL may include a thermochromic pigment having light transmittance that varies according to a temperature. Thus, the light transmittance of the bending protection layer BPL may be adjusted according to the temperature. For example, the light transmittance of the bending protection layer BPL may increase at a temperature equal to or higher than a reference temperature and decrease at a temperature lower than the reference temperature.

As used herein, the "thermochromic pigment" may refer to a pigment of which light transmittance and a color are changed according to a temperature. The thermochromic pigment may have material characteristics, in which the thermochromic pigment becomes transparent when the temperature rises above the reference temperature, and a color is changed when the temperature falls below the reference temperature. Thermochromic pigments may be classified into a reversible thermochromic pigments, in which light transmittance and color change are reversible according to a temperature, and irreversible thermochromic pigment, in which only one color change is possible. In an embodiment, the thermochromic pigment may be the reversible thermochromic pigment of which the light transmittance and the color according to the temperature are reversible.

In this specification, in describing the light transmittance of the bending protection layer BPL, the "light transmittance" may mean transmittance of light in a ultraviolet region. For example, the "light transmittance" may mean light transmittance in a wavelength region of about 100 nm or more and about 400 nm or less.

In an embodiment, the light transmittance of the bending protection layer BPL may be about 50% or more at a temperature equal to or higher than the first temperature. For example, the light transmittance of the bending protection layer BPL may be about 50% or more and about 95% or less at the first temperature or higher. The bending protection layer BPL may have light transmittance of about 50% or more with respect to light in the ultraviolet region at the first temperature or higher. For example, the bending protection layer BPL may have light transmittance of about 50% or more with respect to light in a wavelength region of about 100 nm or more and about 400 nm or less at the first temperature or more. When the light transmittance of the bending protection layer BPL at the first temperature or higher is within such range, the intensity or amount of light transmitted through the bending protection layer BPL may increase during curing, and thus, the residual amount of uncured base resin may be reduced.

The light transmittance of the bending protection layer BPL may be about 1% or less at a temperature lower than the first temperature. For example, the light transmittance of the bending protection layer BPL may be 0% or more and about 1% or less at a temperature lower than the first temperature. The bending protection layer BPL may have light transmittance of about 1% or less with respect to light in the ultraviolet region at a temperature lower than the first temperature. For example, the bending protection layer BPL may have light transmittance of about 1% or less with respect to light in a wavelength region of about 100 nm or more and about 400 nm or less at a temperature less than the first temperature. When the light transmittance of the bending protection layer BPL at a temperature lower than the first temperature is within such a range, the bending protection layer BPL may have sufficient light blocking properties after the curing to prevent the data driver DDV from being damaged by the light.

The bending protection layer BPL may exhibit a first color at a temperature lower than the first temperature and may be transparent at the first temperature or higher. In an embodiment, the first color may be a black color. For example, the bending protection layer BPL may have the black color at a temperature less than the first temperature. However, the embodiments are not limited thereto, and the color of the bending protection layer BPL that is changed at a temperature lower than the first temperature may be a color other than the black color.

To prevent deterioration or malfunction due to light incident into the data driver DDV, the bending protection layer BPL disposed on the data driver DDV may have low light transmittance. For example, the light transmittance in the bending protection layer BPL may be lowered by adding a black matrix material, a black organic/inorganic pigment, or a colorant such as a dye. However, when such a material is used, since the material absorbs light in an ultraviolet wavelength region, which is used as a light source when curing the bending protection layer BPL, exposure sensitivity of the bending protection layer BPL is deteriorated.

In an embodiment, since the thermochromic pigment in the bending protection layer BPL is a material having light transmittance that varies according to a temperature, the light transmittance may increase during the curing to raise sensitivity to light. After the curing, the light transmittance of the bending protection layer BPL may decrease to prevent the deterioration and malfunction due to the light incident into the data driver DDV, thereby improving the reliability of the display device DD.

In an embodiment, the first temperature may be about 30° C. or more. For example, the first temperature may be about 30° C. or more and about 80° C. or less. However, the embodiments are not limited thereto. To allow the bending protection layer BPL to exhibit the first color having low light transmittance when the display device DD is driven, the temperature of the bending protection layer BPL has to be less than the first temperature. For example, to prevent the color of the bending protection layer BPL from being changed to be transparent by reaching the first temperature that is the reference temperature, the reference temperature of the thermochromic pigment may be set to a temperature higher than a maximum temperature at which the bending protection layer BPL reaches when the display device DD is driven. For example, in case that the maximum temperature, at which the bending protection layer BPL reaches when the display device DD is driven, is less than about 50° C., the thermochromic pigment may be manufactured to have a reference temperature of about 50° C. or more.

Referring again to FIGS. 5 and 6, as the bending area BA of the display panel DP is bent, the second area AA2 may be disposed under the first area AA1. Thus, the data driver DDV and the printed circuit board PCB may be disposed under the first area AA1. The data driver DDV and the printed circuit board PCB may be disposed under the support layer PLT. The bottom surface of the base layer provided in the printed circuit board PCB may be disposed to face a bottom surface of the support layer PLT.

The panel protection layer PPL may be disposed below the display panel DP. The panel protection layer PPL may protect a lower portion of the display panel DP. The panel protection layer PPL may include a flexible plastic material. The panel protection layer PPL may prevent scratches on a rear surface of the display panel DP from occurring during the process of manufacturing the display panel DP. The panel protection layer PPL may be a colored polyimide film. For example, the panel protection layer PPL may be an opaque yellow film, but is not limited thereto.

In an embodiment, the panel protection layer PPL may not be disposed on the bending area BA. The panel protection layer PPL may include a first panel protection layer PPL-1 disposed under the first area AA1 of the display panel DP and a second panel protection layer PPL-2 disposed under the second area AA2 of the display panel DP. When the bending area BA is bent, the second panel protection layer PPL-2 may be disposed under the first area AA1 and the first panel protection layer PPL-1 together with the second area AA2 of the display panel DP. Since the panel protection layer PPL is not disposed on the bending area BA, the bending area BA may be more easily bent.

The fourth adhesive layer AL4 may bond the panel protection layer PPL to the display panel DP. The fourth adhesive layer AL4 may include a first portion AL4-1 corresponding to the first panel protection layer PPL-1 and a second portion AL4-2 corresponding to the second panel protection layer PPL-2. The first portion AL4-1 may bond the first panel protection layer PPL-1 to the first area AA1 of the display panel DP, and the second portion AL4-2 may bond the second panel protection layer PPL-2 to the second area AA2 of the display panel DP.

The barrier layer BRL may be disposed below the panel protection layer PPL. The fifth adhesive layer AL5 may be disposed between the panel protection layer PPL and the barrier layer BRL to bond the barrier layer BRL to the panel protection layer PPL. The fifth adhesive layer AL5 may be attached to a top surface of the barrier layer BRL, and the fifth adhesive layer AL5 may be referred to as an upper adhesive layer.

The barrier layer BRL may improve resistance to compressive force due to external pressing. Thus, the barrier layer BRL may prevent the display panel DP from being deformed. The barrier layer BRL may include a flexible plastic material such as polyimide or polyethylene terephthalate.

The barrier layer BRL may absorb light incident from the outside. The barrier layer BRL may include a light blocking material or a colored film having low light transmittance. For example, the barrier layer BRL may be a black plastic film, for example, a black polyimide film. When the display module DM is viewed from an upper side of the window module WM, components disposed under the barrier layer BRL may not be visible to a user.

The support layer PLT is disposed under the barrier layer BRL. The support layer PLT may include a material having an elastic modulus of about 60 GPa or more. The support layer PLT may include a metal material such as stainless steel. For example, the support layer PLT may include SUS 304, but is not limited thereto, and the support layer PLT may include various metal materials. Also, the support layer PLT may support the display panel DP. Also, heat dissipation performance of the display device DD may be improved by the support layer PLT.

Openings OP may be defined in a portion of the support layer PLT, which corresponds to the folding area FA0. Flexibility of the support layer PLT may be improved by the openings OP.

A surface area of the barrier layer BRL may be less than the surface area of the support layer PLT in a plan view. In a plan view, the barrier layer BRL may overlap a portion of the support layer PLT. The other portion of the support layer PLT may not overlap the barrier layer BRL.

The sixth adhesive layer AL6 may be disposed between the barrier layer BRL and the support layer PLT. The sixth adhesive layer AL6 may bond the barrier layer BRL and the support layer PLT to each other. The sixth adhesive layer AL6 (hereinafter, referred to as a barrier adhesive layer) may include a first portion AL6-1 (hereinafter, referred to as a first barrier portion) and a second portion AL6-2 (hereinafter, referred to as a second barrier portion), which are spaced apart from each other.

The first barrier part AL6-1 and the second barrier part AL6-2 may be spaced apart from each other with the openings OP therebetween. In a plan view, the barrier adhesive layer AL6 may not overlap the openings OP. Also, in a plan view, the barrier adhesive layer AL6 may be spaced apart from the openings OP.

The first barrier portion AL6-1 may overlap the first non-folding area NFA10, the second barrier portion AL6-2 may overlap the second non-folding area NFA20, and each of the first barrier portion AL6-1 and the second barrier portion AL6-2 may not overlap the folding area FA0. Since the barrier adhesive layer AL6 is not disposed on the area corresponding to the folding area FA0, the flexibility of the support layer PLT may be improved.

On the area overlapping the folding area FA0, the barrier layer BRL may be spaced apart from the support layer PLT. For example, an empty space ES may be defined between the support layer PLT and the barrier layer BRL at the portion overlapping the folding area FA0. Air may be disposed in the empty space ES.

When the display device DD is folded, since the empty space ES is defined between the barrier layer BRL and the support layer PLT, shapes of the openings OP defined in the support layer PLT may not be seen from the outside of the display device DD.

Also, as the barrier layer BRL includes the light blocking material or is applied as the colored film having the low light transmittance, a color difference between the support layer PLT may not be visible from the outside. For example, in the support layer PLT, a color difference between the first support area, in which the openings OP is defined, and the second support area, in which the openings OP are not defined, may not be visible from the outside. The first support area may be an area overlapping the folding area FA0, and the second support area may be an area overlapping the first non-folding area NFA10 and the second non-folding area NFA20.

The barrier adhesive layer AL6 may have a thickness less than that of the fifth adhesive layer AL5. For example, the fifth adhesive layer AL5 may have a thickness of about 25 μm, and the barrier adhesive layer AL6 may have a thickness of about 16 μm.

As the thickness of the barrier adhesive layer AL6 decreases, a step difference due to the barrier adhesive layer AL6 may be reduced. As the step difference is smaller, shape deformation of the laminated structures due to the folding and unfolding of the display device DD may be reduced. However, the openings OP may be seen, or the barrier adhesive layer AL6 may be separated by the repeated folding operations. As the thickness of the barrier adhesive layer AL6 increases, the openings OP may not be visible, and reliability of adhesive force of the barrier adhesive layer AL6 may be improved by the repeated folding operations. Thus, the thickness of the barrier adhesive layer AL6 may be selected within an appropriate range in consideration of folding reliability, adhesion reliability, and visibility of the openings OP.

The seventh adhesive layer AL7 (hereinafter, referred to as a first cover adhesive layer) may be disposed under the support layer PLT, and the cover layer SCV may be disposed under the first cover adhesive layer AL7. The support layer PLT and the cover layer SCV may be bonded to each other by the first cover adhesive layer AL7. The cover layer SCV may be manufactured in the form of a sheet and attached to the support layer PLT.

The first cover adhesive layer AL7 and the cover layer SCV may cover the openings OP defined in the support layer PLT. Thus, the cover layer SCV may prevent foreign substances from being introduced into the openings OP. The cover layer SCV may have an elastic modulus less than that of the support layer PLT. For example, the cover layer SCV may include, thermoplastic polyurethane, rubber, or silicone, but the embodiments are not limited thereto.

The eighth adhesive layer AL8 (hereinafter, referred to as a second cover adhesive layer) may be disposed under the cover layer SCV. The second cover adhesive layer AL8 may include a first cover portion AL8-1 and a second cover portion AL8-2. The first cover portion AL8-1 and the second cover portion AL8-2 may be spaced apart from each other. In a plan view, the first cover portion AL8-1 and the second cover portion AL8-2 may be spaced apart from each other with the openings OP therebetween. The first cover portion AL8-1 and the second cover portion AL8-2 may not overlap each other on the folding area FA0.

The heat dissipation layer RHL may be disposed under the second cover adhesive layer AL8. The heat dissipation layer RHL may be a sheet having high thermal conductivity. The heat dissipation layer RHL may include a metal or a metal alloy, for example, the heat dissipation layer RHL may include copper, a copper alloy, or graphite.

The heat dissipation layer RHL may include a first heat dissipation layer RHL-1 and a second heat dissipation layer RHL-2. The first heat dissipation layer RHL-1 and the second heat dissipation layer RHL-2 may be spaced by a gap GP from each other. The gap GP may be in a range of about 0.4 mm (millimeter) to about 2.4 mm, but is not particularly limited thereto. The gap GP may be provided to correspond to the folding area FA0.

The first heat dissipation layer RHL-1 may be coupled to the cover layer SCV through the first cover portion AL8-1, and the second heat dissipation layer RHL-2 may be coupled to the cover layer SCV through the second cover portion AL8-2. In a plan view, the first heat dissipation layer RHL-1 may overlap a portion of the folding area FA0 and the first non-folding area NFA10, and the second heat dissipation layer RHL-2 may overlap the other portion of the folding area FA0 and the second non-folding area NFA20.

In a plan view, a portion of the first heat dissipation layer RHL-1 may overlap a portion of the openings OP, and a portion of the second heat dissipation layer RHL-2 may overlaps the other portion of the openings OP. The first heat dissipation layer RHL-1 and the second heat dissipation layer RHL-2 may serve to support the support layer PLT. For example, the area in which the openings OP of the support layer PLT are defined may be supported by the first heat dissipation layer RHL-1 and the second heat dissipation layer RHL-2. Thus, the first heat dissipation layer RHL-1 and the second heat dissipation layer RHL-2 may be referred to as a first lower support layer and a second lower support layer, respectively.

The ninth adhesive layer AL9 may be disposed under the heat dissipation layer RHL. The ninth adhesive layer AL9 may include a first portion AL9-1 corresponding to the first heat dissipation layer RHL-1 and a second portion AL9-2 corresponding to the second heat dissipation layer RHL-2. The first portion AL9-1 and the second portion AL9-2 may be spaced by a gap GP from each other.

The cushion layer CUL may be disposed under the ninth adhesive layer AL9. The cushion layer CUL may have a thickness of about 75 but is not particularly limited thereto. The cushion layer CUL may absorb an external impact to protect the display panel DP. The cushion layer CUL has an elastic modulus less than that of the support layer PLT. The cushion layer CUL may include a foam sheet having elastic force. The cushion layer CUL may include sponge or polyurethane.

The cushion layer CUL may include a first cushion layer CUL-1 corresponding to the first portion AL9-1 and a second cushion layer CUL-2 corresponding to the second part AL9-2. The first cushion layer CUL-1 and the second cushion layer CUL-2 may be spaced by a gap GP from each other. In a plan view, the gap GP between the first cushion layer CUL-1 and the second cushion layer CUL-2 may overlap the folding area FA0. In a plan view, the first cushioning layer CUL-1 may overlap a portion of the folding area FA0 and the first non-folding area NFA10, and the second cushioning layer CUL-2 may overlap the other portion of the folding area FA0 and the second non-folding area NFA20.

When the cushion layer CUL is disposed between the support layer PLT and the display panel DP, a shape of the cushion layer CUL may be deformed together when the display panel DP is pressed, and thus, the display panel DP may be easily deformed. However, according to an embodiment, the cushion layer CUL is spaced apart from the display panel DP with the support layer PLT therebetween. Thus, when the display panel DP is pressed, the deformation of the display panel DP may be reduced. As the cushion layer CUL is disposed under the heat dissipation layer RHL that is firmly supported, impact absorption performance of the cushion layer CUL may be improved. The insulating layer INL may be disposed under the cushion layer CUL. The insulating layer INL may be, for example, an insulating tape. The insulating layer INL may prevent static electricity from being introduced. Although not shown, the flexible circuit film FCB may be disposed on the insulating layer INL. The insulating layer INL may prevent the flexible circuit film FCB from electrical interfering with members disposed on the insulating layer INL.

A surface of the step compensation pattern CP may be bonded to the support layer PLT through the tenth adhesive layer AL10. The eleventh adhesive layer AL11 is disposed on the other surface of the step difference compensation pattern CP.

Referring to FIG. 6, the bending area BA may be bent so that the second area AA2 is disposed under the first area AA1. Thus, the data driver DDV may be disposed under the first area AA1. For example, the first area AA1 and the second area AA2 are disposed on different planes (or reference planes). The bending area BA may be bent to be convex in a horizontal direction in a cross-section. The bending area BA has a curvature and a curvature radius. The curvature radius may be in a range of about 0.1 mm to about 0.5 mm.

The bending protection layer BPL is disposed on at least the bending area BA. The bending protection layer BPL may be disposed on a portion of the first area AA1 and a portion of the second area AA2 as well as the bending area BA. The bending protection layer BPL may overlap the bending area BA, the first area AA1, and the second area AA2.

The bending protection layer BPL may be bent together with the bending area BA. The bending protection layer BPL protects the bending area BA from an external impact and controls a neutral plane of the bending area BA. The bending protection layer BPL controls stress of the bending area BA so that the neutral plane approaches the signal lines disposed on the bending area BA.

The spacer SPC may be disposed between the support layer PLT and the second panel protection layer PPL2. Although the spacer SPC is illustrated as a single layer in FIGS. 5 and 6, the spacer SPC may have a multi-layered structure in which a base layer is disposed between two adhesive layers. The base layer may include graphite having heat dissipation properties. A side of the support layer PLT and a side of the spacer SPC may be aligned a one side of the barrier layer BRL, but the embodiments are not limited thereto. For example, the side of the support layer PLT and the side of the spacer SPC may not be aligned with the side of the barrier layer BRL.

The spacer SPC may be a double-sided tape. For example, the spacer SPC may include a base layer such as flexible polyethylene terephthalate and an adhesive disposed on top and bottom surfaces of the base layer. The support layer PLT and the second panel protection layer PPL2 may be spaced apart from each other by the spacer SPC so that the bending area BA is maintained at a selected curvature.

Figure 7:
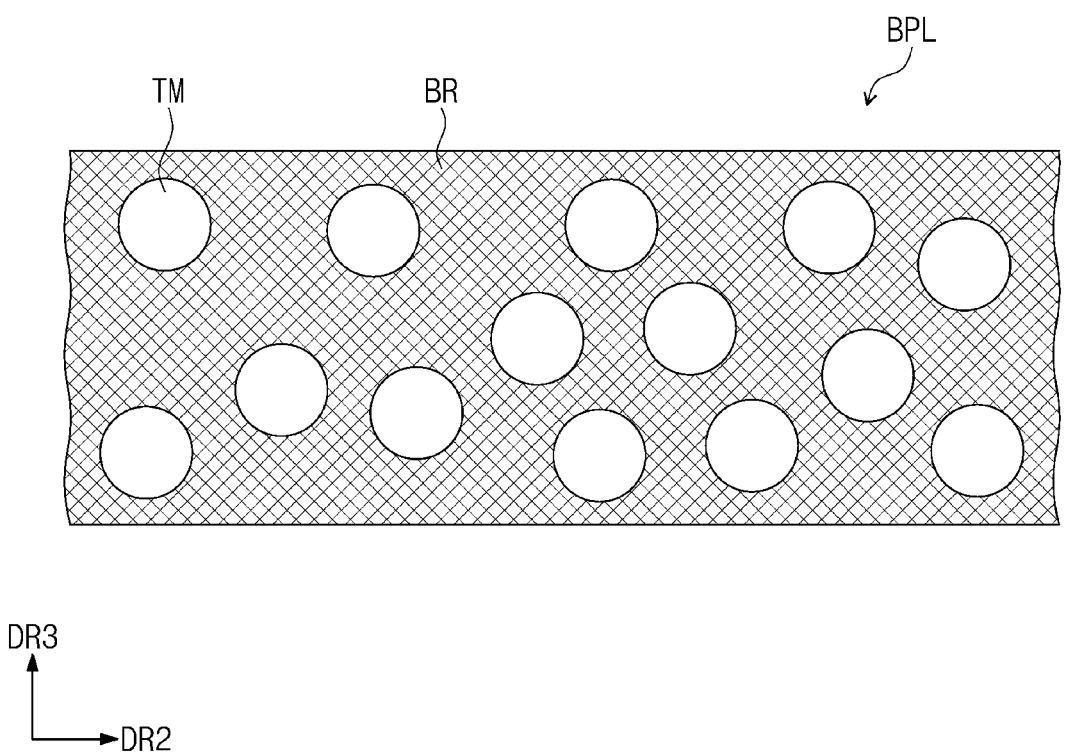
FIG. 7 is a schematic cross-sectional view of a bending protection layer according to an embodiment.
Figure 8A:
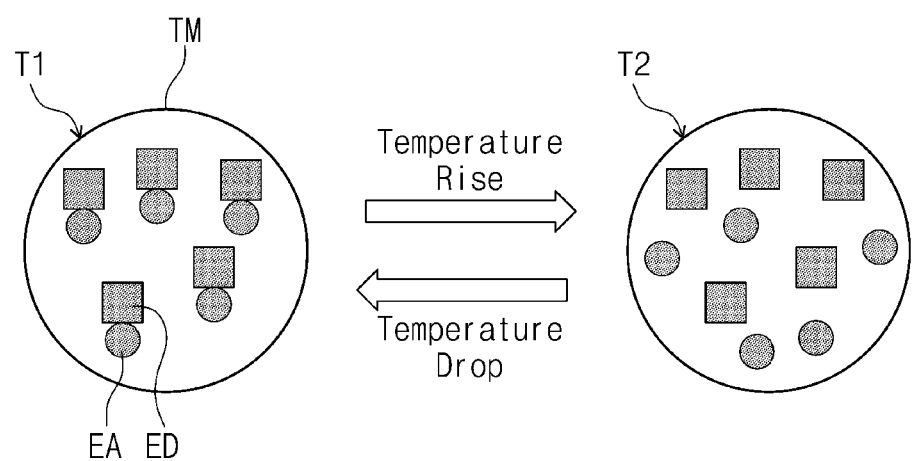
FIGS. 8A and 8B are schematic views illustrating a thermochromic pigment according to an embodiment.
Figure 8B:
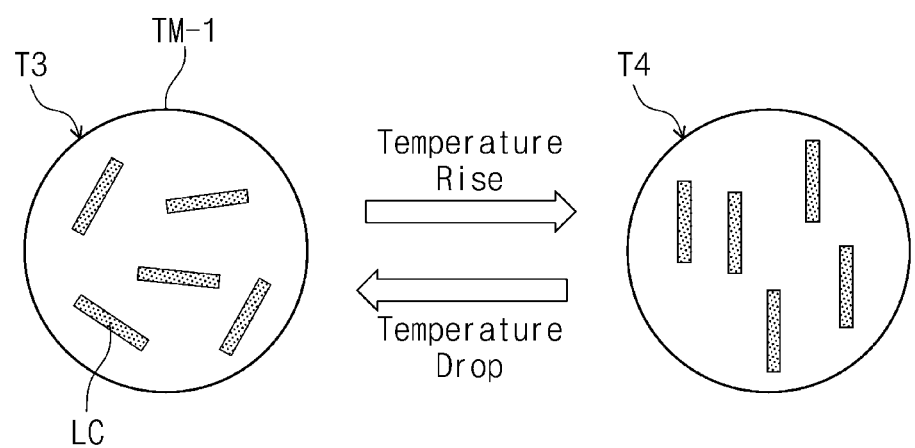

FIG. 7 is a schematic cross-sectional view of the bending protection layer according to an embodiment. FIGS. 8A and 8B are schematic views illustrating the thermochromic pigment according to an embodiment.

Referring to FIG. 7, the bending protection layer BPL may include a base resin BR and a thermochromic pigment TM. The bending protection layer BPL may be formed by applying and curing a resin RS (refer to FIG. 10A) including the base resin BR, the thermochromic pigment TM, and a photoinitiator on the display panel DP (refer to FIG. 10A). In the bending protection layer BPL, the thermochromic pigment TM may be dispersed in the base resin BR.

In an embodiment, the thermochromic pigment TM may be transparent at the first temperature or higher and exhibit the first color at a temperature lower than the first temperature. In an embodiment, the first color may be a black color. Since the thermochromic pigment TM is transparent at the first temperature or higher, exposure efficiency may be improved by transmitting ultraviolet rays during exposure. Since the thermochromic pigment TM exhibits a black color at a lower less than the first temperature, light blocking properties of the bending protective layer BPL may be improved after the bending protective layer BPL is cured.

In an embodiment, light transmittance of the thermochromic pigment TM at the first temperature or higher may be about 50% or more. For example, the light transmittance of the thermochromic pigment TM may be about 50% or more and about 95% or less at the first temperature or higher. The thermochromic pigment TM may have light transmittance of about 50% or more with respect to light in the ultraviolet region at the first temperature or more. For example, the thermochromic pigment TM may have light transmittance of about 50% or more with respect to light in a wavelength region of about 100 nm or more and about 400 nm or less at the first temperature or higher.

In an embodiment, the light transmittance of the thermochromic pigment TM at a temperature lower than the first temperature may be about 1% or less. For example, the light transmittance of the thermochromic pigment TM at a temperature lower than the first temperature may be 0% or more and about 1% or less. The thermochromic pigment TM may have light transmittance of about 1% or less with respect to light in the ultraviolet region at a temperature lower than the first temperature. For example, the thermochromic pigment TM may have light transmittance of about 1% or less with respect to light in a wavelength region of about 100 nm or more and about 400 nm or less at a temperature lower than the first temperature.

The base resin BR may include a material having relatively high light transmittance. The base resin BR may be made of a transparent material. The base resin BR may include a polymer material. The base resin BR may include at least one of an acrylic polymer, a silicone polymer, a urethane polymer, and an imide polymer. For example, the base resin BR may include one of polymeric materials selected from acrylic-based polymers, silicone-based polymers, urethane-based polymers, and imide-based polymers, or a combination of polymer materials. In an embodiment, the base resin BR may include at least one of a silicone-based polymer, polycarbonate (PC), poly methyl methacrylate (PMMA), polystyrene (PS), and polyethylene terephthalate (PET).

The base resin BR may be made of an acrylic-based resin, a silicone-based resin, a urethane-based resin, or an imide-based resin. The base resin BR may be formed by solidifying a polymer resin such as an acrylic-based resin, a silicone-based resin, a urethane-based resin, or an imide-based resin in an ultraviolet treatment process.

In an embodiment, the thermochromic pigment TM may be contained at about 1 wt % or more based on the total weight of the base resin BR. For example, the thermochromic pigment TM may be contained at a range of about 1 wt % to about 50 wt % based on the total weight of the base resin BR. However, the embodiments are not limited thereto, and the weight of the thermochromic pigment TM contained in the base resin BR may be selected within an appropriate range in consideration of the material type and treatment process.

Referring to FIGS. 7, 8A, and 8B, each of the thermochromic pigments TM and TM-1 contained in the bending protection layer BPL according to an embodiment may be provided in the form of a microcapsule. In an embodiment, each of the thermochromic pigments TM and TM-1 may have a sphere shape.

Referring to FIG. 8A, the thermochromic pigment TM may include an electron donor ED and an electron acceptor EA. The thermochromic pigment TM may include the electron donor ED and the electron acceptor EA in the microcapsule. The thermochromic pigment TM may be a reversible thermochromic pigment that is changed into a first state T1 or a second state T2 according to a reference temperature. The thermochromic pigment TM may have the first state T1 at a temperature less than the first temperature, which is the reference temperature, and may have the second state T2 that is different from the first state T1 at the first temperature or more. The first state T1 may be a state in which the electron donor ED and the electron acceptor EA are bound to each other, and the second state T2 may be a state in which the electron donor ED and the electron acceptor EA are not bound but separated from each other. When the thermochromic pigment TM is in the first state T1, the electron donor ED and the electron acceptor EA are bound with each other to exhibit the first color, and when the thermochromic pigment TM is in the second state T2, the electron donor ED and the electron acceptor EA may be separated from each other to be transparent.

Referring to FIG. 8B, the thermochromic pigment TM-1 may include liquid crystal molecules LC. The thermochromic pigment TM-1 may include the liquid crystal molecules LC in the microcapsule. The liquid crystal molecules LC contained in the thermochromic pigment TM-1 may be colored or transparent by changing an arrangement of the molecules according to a temperature. The thermochromic pigment TM-1 may be a reversible thermochromic pigment that is changed into a third state T3 or a fourth state T4 according to the reference temperature. For example, the thermochromic pigment TM-1 may have the third state T3 at a temperature less than the first temperature, which is the reference temperature, and may have the fourth state T4 different from the third state T3 at the first temperature or more. The third state T3 may refer to a state in which the liquid crystal molecules LC are arranged randomly, and the fourth state T4 may refer to a state in which the liquid crystal molecules LC are arranged in a specific direction. When the thermochromic pigment TM-1 is in the third state T3, the liquid crystal molecules LC are randomly arranged to exhibit the first color, and when the thermochromic pigment TM-1 is in the fourth state T4, the liquid crystal molecules LC may be arranged in a specific direction to be transparent.

Hereinafter, a method for manufacturing the display device according to an embodiment will be described with reference to FIGS. 9, 10A to 10C. In description of the method for manufacturing the display device according to an embodiment, the display device may be applied to the display device according to the above-mentioned embodiment. Hereinafter, in description of the method for manufacturing the display device according to an embodiment, duplicated description will be omitted, and thus, differences therebetween will be described.

Figure 9:
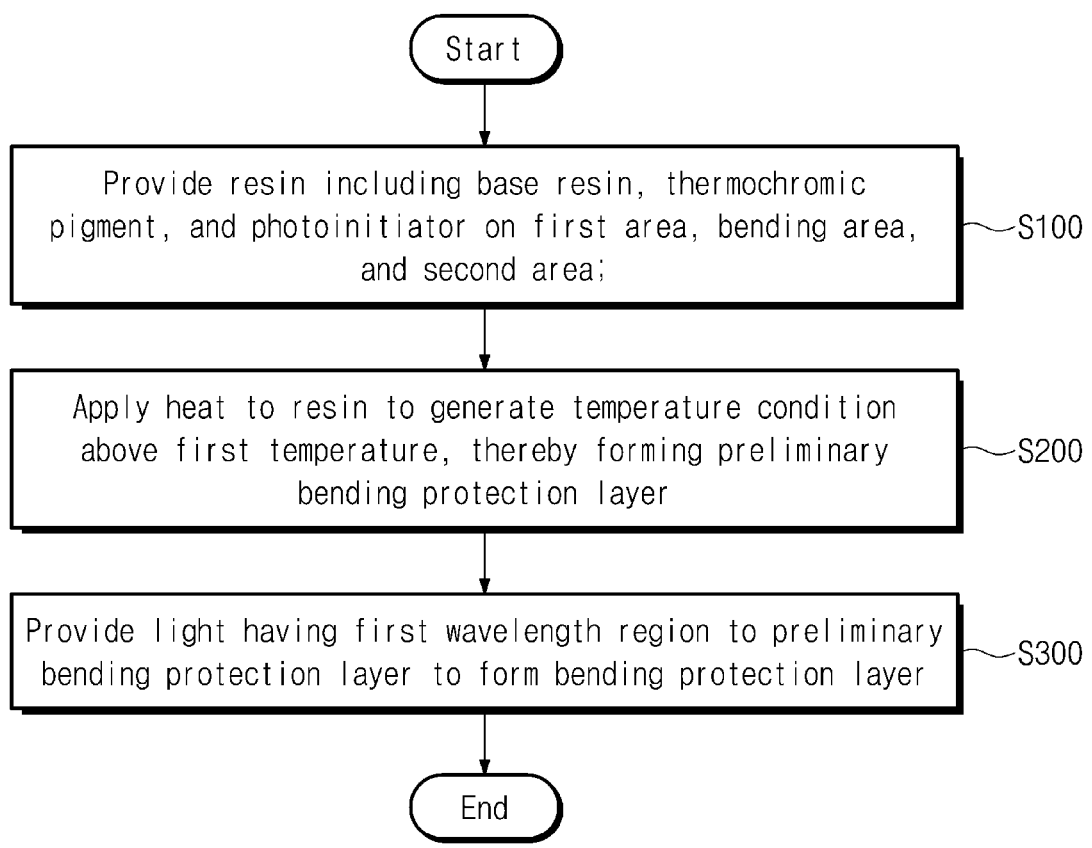
FIG. 9 is a flowchart illustrating a method for manufacturing a display device according to an embodiment.
Figure 10A:
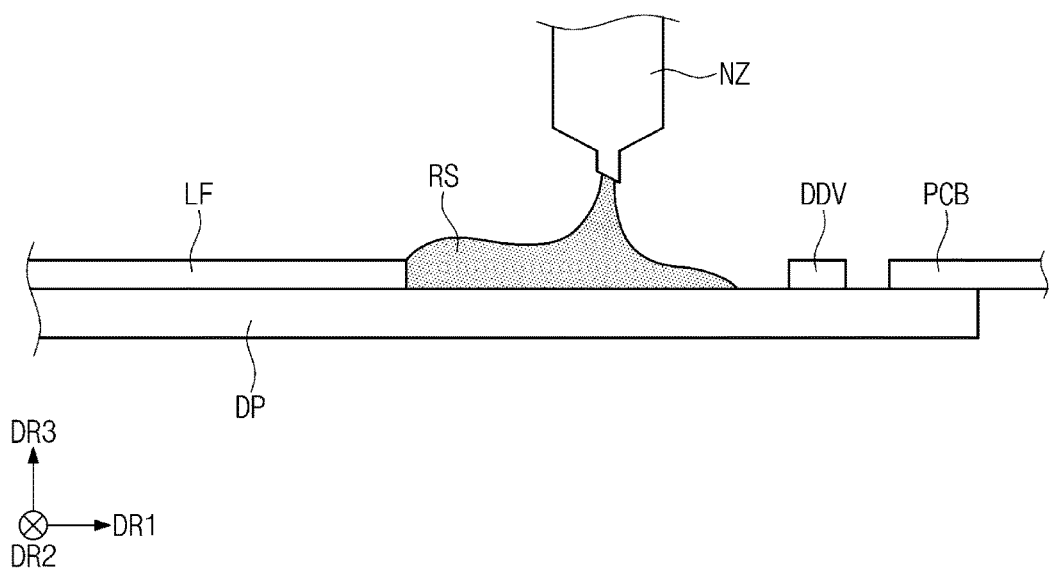
FIGS. 10A to 10C are schematic views illustrating processes in the method for manufacturing the display device according to an embodiment.
Figure 10B:
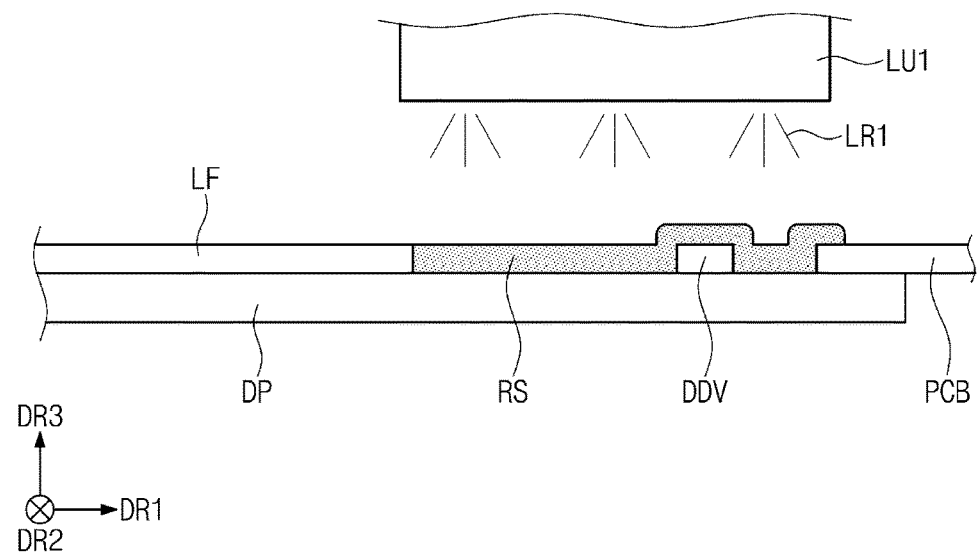
Figure 10C:
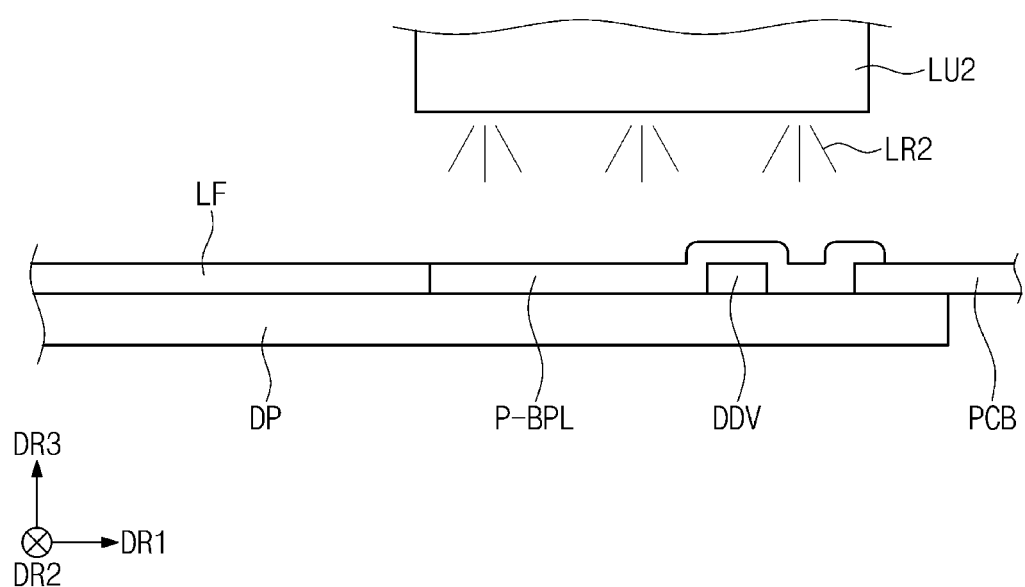

FIG. 9 is a flowchart illustrating a method for manufacturing a display device according to an embodiment. FIGS. 10A to 10C are schematic views sequentially illustrating processes in the method for manufacturing the display device according to an embodiment.

The method for manufacturing the display device according to an embodiment may be a method for manufacturing the display device DD of FIGS. 1A to 6 according to an embodiment. According to an embodiment, a method for manufacturing a display device including a bending area BA of the display device DD and a bending protection layer BPL protecting the data driver DDV is provided.

Referring to FIG. 9, the method for manufacturing the display device according to an embodiment may include a process (S100) of providing a resin including a base resin, a thermochromic pigment, and a photoinitiator on a first area, a bending area, and a second area of a display panel, a process (S200) of applying heat to the resin to generate a temperature condition of a first temperature or more to form a preliminary bending protection layer, and a process (S300) of providing light having a first wavelength region to the preliminary bending protection layer to form a bending protection layer.

FIG. 10A schematically illustrates the process (S100) of providing the resin including the base resin, the thermochromic pigment, and the photoinitiator to the first area, the bending area, and the second area of the display panel.

Referring to FIGS. 5 and 10A, a resin RS may be provided on a display panel DP through a supply nozzle NZ. The resin RS may be provided on the first area AA1, the bending area BA, and the second area AA2 in the display panel DP on which an anti-reflection layer LF, a data driver DDV, and a printed circuit board PCB are disposed. For example, the resin RS may be provided after the anti-reflection layer LF, the data driver DDV, and the printed circuit board PCB are disposed on the display panel DP. The resin RS may be provided on the bending area BA. The resin RS may be provided to cover the data driver DDV overlapping the second area AA2 as well as the bending area BA. Also, the resin RS may be provided to cover a portion of the printed circuit board PCB disposed on an edge of the second area AA2 of the display panel DP. In FIG. 10A, although the resin RS is applied to the display panel DP to not overlap the anti-reflection layer LF in a plan view, the embodiments are not limited thereto. For example, the resin RS may be provided to cover an edge of the anti-reflection layer LF. In other examples, the resin RS may be applied to an area that is spaced apart a selected distance from a side surface of the anti-reflection layer LF on the display panel DP, and after the resin RS is cured, a bending protection layer BPL may be disposed to be spaced apart from a distal end of the anti-reflection layer LF.

The resin RS may include a base resin BR (refer to FIG. 7), a thermochromic pigment TM (refer to FIG. 7), and a photoinitiator. The base resin may include at least one of an acrylic-based resin, a silicon-based resin, and an imide-based resin. The base resin may be provided in the form of a monomer or oligomer of the acrylic-based resin, the silicon-based resin, or the imide-based resin. The base resin BR contained in the resin RS may be in a liquid form before being cured.

The resin RS may include at least one photoinitiator. In an embodiment, the photoinitiator may be a photoinitiator activated by light LR2 in the first wavelength region (refer to FIG. 10C). The light having the first wavelength region may be ultraviolet light having a central wavelength in a wavelength region of about 100 nm or more and about 400 nm or less. The first initiator may be a photoinitiator that is activated by ultraviolet light having a central wavelength in a wavelength range of about 315 nm to about 395 nm. When the resin RS includes photoinitiators, the different photoinitiators may be activated by ultraviolet light having different central wavelength regions, respectively. In this specification, the central wavelength represents a wavelength representing a maximum intensity of an emission peak in an emission spectrum of a light source.

For example, the photoinitiator may be selected from the group consisting of 2,2-dimethoxy-1,2-diphenylethan-1-one, 1-hydroxy-cyclohexyl-phenyl-ketone, 2-hydroxy-2-methyl-1-phenyl-1-propanone, 2-hydroxy-1-[4-(2-hydroxyethoxy)phenyl]-2-methyl-1-propanone, and 2-hydroxy-1-{4-[4-(2-hydroxy-2-methyl-propionyl)-benzyl]-phenyl}-2-methylpropan-1-one.

Also, the photoinitiator may be selected from the group consisting of 2-methyl-1[4-(methylthio)phenyl]-2-morpholinopropan-1-one, 2-benzyl-2-dimethylamino-1-(4-morpholinophenyl)-butanone-1,2-dimethylamino-2-(4-methylbenzyl)-1-(4-morpholin-4-yl-phenyl)-butan-1-one, 2,4,6-trimethylbenzoyl-diphenylphosphine oxide, 2,4,6-trimethylbenzoyl-diphenyl phosphinate, bis(2,4,6-trimethylbenzoyl)-phenylphosphineoxide, [1-(4-phenylsulfanylbenzoyl)heptylideneamino]benzoate, [1-[9-ethyl-6-(2-methylbenzoyl)carbazol-3-yl]ethylideneamino] acetate, and Bis(2,4-cyclopentadienyl)bis[2,6-difluoro-3-(1-pyrryl)phenyl]titanium(IV).

The resin RS may be provided on the display panel DP in various methods. For example, the resin RS may be provided on the display panel DP through methods such as a jetting method, a slit coating method, a spin coating method, and a transfer coating method.

FIG. 10B is a schematic view illustrating the process of (S200) of applying heat to the resin to generate a temperature condition of the first temperature or higher, to form the preliminary bending protection layer.

Referring to FIGS. 5 and 10B, light LR1 having a second wavelength region, which is emitted from a first light source LU1, may be provided to the resin RS provided on the display panel DP to heat the resin RS. The first light source LU1 may provide the light LR1 having the second wavelength region. In the process of applying the heat by providing the light LR1 having the second wavelength region to the resin RS, a temperature of the resin RS may be equal to or higher than the first temperature. Thus, the resin RS provided on the first area AA1, the bending area BA, and the second area AA2 of the display panel DP may be changed to be transparent, thereby forming the preliminary bending protection layer P-BPL.

In an embodiment, the resin RS may be maintained to a temperature lower than the first temperature in the process (S100) of providing the resin on the display panel and then be heated to the first temperature or more in the process (S200) of generating the temperature condition of the first temperature or more to form the preliminary bending protection layer. For example, the resin RS may be maintained to a temperature lower than the first temperature and may exhibit a first color in the process (S100), when the resin is provided on the display panel. The resin RS may be heated to the first temperature or more and changed to be transparent in the process (S200) of generating the temperature condition of the first temperature or more to form the preliminary bending protection layer.

In an embodiment, the light LR1 having the second wavelength region provided by the first light source LU1 may be light having an infrared region in which a center wavelength ranges of about 700 nm or more and about 4.5 µm or less. The type of the first light source LU1 is not particularly limited, and may be, for example, an IR heater. For example, the resin RS applied to the display panel DP may be directly heated by the IR heater.

Referring to FIGS. 10B and 10C, the first light source LU1 may apply heat to the resin RS by providing the light LR1 having the second wavelength region to form a temperature condition that is equal to or higher than the first temperature. Under the temperature condition that is equal to or higher than the first temperature, the resin RS may be changed into a transparent preliminary bending protection layer P-BPL. The resin RS may include a thermochromic pigment of which light transmittance and a color are changed based on the first temperature that is a reference temperature, and the light transmittance and the color are changed according to a temperature change due to heat from the first light source LU1. The thermochromic pigment may have light transmittance of about 50% or more at the first temperature or more, and light transmittance of about 1% or less at a temperature lower than the first temperature. For example, the thermochromic pigment may be transparent at the first temperature or higher and exhibit a black color at a temperature lower than the first temperature. Thus, heat may be generated from the first light source LU1 to change a temperature of the resin RS to a temperature equal to or higher than the first temperature so that the resin RS is changed to be transparent, and to form the preliminary bending protection layer P-BPL. When the resin RS has the first temperature or higher, the preliminary bending protection layer P-BPL may be formed as the thermochromic pigment contained in the resin RS is changed to be transparent.

In the process illustrated as an example in FIG. 10B, the preliminary bending protection layer P-BPL may be disposed on the display panel DP to cover a data driver DDV disposed on the display panel DP. Also, the preliminary bending protection layer P-BPL may overlap at least a portion of a printed circuit board PCB. For example, the preliminary bending protection layer P-BPL may cover an edge portion of the printed circuit board PCB.

FIG. 10C illustrates the process of (S300) of applying light having the first wavelength region to preliminary bending protection layer to form the bending protection layer.

Referring to FIG. 10C, the bending protection layer BPL (refer to FIG. 5) may be formed by curing the preliminary bending protection layer P-BPL formed by applying heat having a temperature that is equal to or higher than the first temperature. The preliminary bending protection layer P-BPL may be in a state in which the base resin of the resin RS is not cured. The preliminary bending protection layer P-BPL may include a base resin in which polymerization and curing are not completed, and may include an unreacted photoinitiator.

In the process (S300) of providing the light having the first wavelength region to the preliminary bending protection layer P-BPL to form the bending protection layer BPL, the preliminary bending protection layer P-BPL may be transparent. For example, the preliminary bending protection layer P-BPL may have transmittance with respect to light in the ultraviolet region, which is greater than that of the resin RS illustrated in FIG. 10A. For example, the light transmittance of the preliminary bending protection layer P-BPL in the ultraviolet region may be about 50% or more. When the preliminary bending protection layer P-BPL has high transmittance with respect to the light having the ultraviolet region, an intensity or amount of light incident to cure the resin in an exposure process may increase. Thus, a residual amount of uncured base resin may be reduced during the curing process, and thus, defects due to the uncured base resin may be prevented, and quality of the display device DD may be improved.

The process of providing light LR2 having the first wavelength region to the preliminary bending protection layer P-BPL to form the bending protection layer BPL (refer to FIG. 5) may be a process of photocuring the preliminary bending protection layer P-BPL. The photocuring of the preliminary bending protection layer P-BPL may include a process of providing the light LR2 having the first wavelength region to the preliminary bending protection layer P-BPL using a second light source LU2. The light LR2 having the first wavelength region may be ultraviolet light having a central wavelength in a wavelength region of about 100 nm or more and about 400 nm or less. The preliminary bending protection layer P-BPL may be photocured by receiving the light LR2 having the first wavelength region from the second light source LU2. In the process of photocuring the preliminary bending protection layer P-BPL, a photoinitiator may be activated by the light LR2 having the first wavelength region to allow unreacted monomers or oligomers contained in the preliminary bending protection layer P-BPL to react, thereby forming the bending protection layer BPL (refer to FIG. 5). Here, an LED, a metal halide lamp, or a mercury lamp may be used as the second light source LU2, but is not limited thereto.

Although not shown, after the process (S300) of forming the bending protection layer by providing the light having the first wavelength region to the preliminary bending protection layer, the bending protection layer may be cooled to a temperature lower than the first temperature to exhibit the first color. For example, the bending protection layer may be maintained to a temperature lower than the first temperature to exhibit a black color. As the bending protection layer is cooled at the temperature lower than the first temperature, the thermochromic pigment contained in the bending protection layer may exhibit the black color. Thus, deterioration and malfunction caused by the UV light incident into the data driver DDV may be prevented.

The display device according to an embodiment may include the bending protection layer disposed on the display panel to cover the data driver, and the bending protection layer may include the thermochromic pigment having the light transmittance that varies according to the temperature. The thermochromic pigment according to an embodiment may be transparent at the first temperature, which is the reference temperature, or higher and exhibit the black color at a temperature less than the first temperature. Therefore, the bending protection layer, in which the light transmittance of the preliminary bending protection layer is improved at the first temperature condition to increase in light transmission during the exposure, and the preliminary bending protection layer is changed into the black color at the temperature lower than the first temperature to provide sufficient light blocking properties may be manufactured to improve the durability and the reliability of the display device.

According to the embodiment, the bending protection layer disposed on the display panel may be provided to cover the data driver, and the bending protection layer may include the thermochromic pigment having the light transmittance that varies according to the temperature of the bending protection layer. Therefore, the bending protection layer, in which the light transmittance of the preliminary bending protection layer is improved at the temperature equal to or higher than the first temperature that is the reference temperature to increase in light transmission during the exposure, and after the curing, the light transmittance is reduced to the temperature lower than the first temperature so that the bending protection layer having the sufficient light blocking properties may be manufactured, and thus, the reliability of the display device may be improved.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the following claims.

What is claimed is:

1. A display device comprising:
   a display panel comprising:
      a first area;
      a second area; and
      a bending area disposed between the first area and the second area, the bending area having a curvature radius;
   a data driver disposed on the display panel and overlapping the second area in a plan view; and
   a bending protection layer disposed on the display panel and the data driver and overlapping the first area, the bending area, and the second area in the plan view,
   wherein the bending protection layer comprises a thermochromic pigment having a light transmittance.

2. The display device of claim 1, wherein
   the light transmittance of the bending protection layer at a temperature lower than a first temperature is 1% or less, and
   the light transmittance of the bending protection layer at another temperature equal to or higher than the first temperature is 50% or more.

3. The display device of claim 1, wherein the bending protection layer exhibits a first color at a temperature lower than a first temperature and is transparent at another temperature equal to or higher than the first temperature.

4. The display device of claim 3, wherein the first color is black.

5. The display device of claim 1, wherein a light transmittance of the thermochromic pigment varies according to a temperature.

6. The display device of claim 1, wherein the thermochromic pigment comprises an electron acceptor and an electron donor.

7. The display device of claim 1, wherein the thermochromic pigment comprises liquid crystal molecules.

8. The display device of claim 1, wherein the bending protection layer covers the data driver.

9. The display device of claim 1, further comprising:
   a printed circuit board bonded to the second area, wherein the bending protection layer overlaps at least a portion of the printed circuit board in the plan view.

10. The display device of claim 1, further comprising:
an anti-reflection layer disposed on the display panel and overlapping the first area in the plan view,
wherein a portion of the bending protection layer which overlaps the first area of the display panel, does not overlap the anti-reflection layer in the plan view.

11. The display device of claim 1, wherein
the first area comprises a first non-folding area, a folding area, and a second non-folding area which are sequentially disposed in a direction, and
the folding area is folded with respect to a folding axis.

12. A display device comprising:
a display panel comprising:
a first area;
a second area; and
a bending area disposed between the first area and the second area, the bending area having a curvature radius;
a data driver disposed on the display panel and overlapping the second area in a plan view; and
a bending protection layer disposed on the display panel and overlapping the first area, the bending area, and the second area in the plan view and that covers the data driver,
wherein the bending protection layer comprises a reversible thermochromic pigment.

13. The display device of claim 12, wherein the reversible thermochromic pigment exhibits a black color at a temperature lower than a first temperature and is transparent at another temperature equal to or higher than the first temperature.

14. The display device of claim 12, wherein
the bending protection layer further comprises a base resin, and
the base resin comprises at least one of an acrylic-based polymer, a urethane-based polymer, a silicon-based polymer, and an imide-based polymer.

15. A method for manufacturing a display device, the method comprising:
providing a resin comprising a base resin, a thermochromic pigment, and a photoinitiator on a first area, a bending area, and a second area;
applying heat to the resin to generate a temperature condition equal to or higher than a first temperature to form a preliminary bending protection layer; and
providing light having a first wavelength region to the preliminary bending protection layer to form a bending protection layer, wherein
the display device comprises a display panel comprising the first area, the bending area, the second area which are disposed sequentially in a direction, and a data driver disposed on the display panel, the data driver overlapping the second area.

16. The method of claim 15, wherein the thermochromic pigment exhibits a first color at a temperature lower than the first temperature and is transparent at-a another temperature equal to or higher than the first temperature.

17. The method of claim 15, wherein the first temperature is in a range of 30° C. to 80° C.

18. The method of claim 15, wherein the forming of the preliminary bending protection layer comprises providing light having a second wavelength region to apply heat to the resin, the second wavelength region and the first wavelength region being different.

19. The method of claim 18, wherein the photoinitiator is activated by the light having the first wavelength region.

20. The method of claim 15, wherein the providing of the resin comprises applying the resin to cover the data driver.

* * * * *